United States Patent
Lin et al.

(10) Patent No.: US 8,865,525 B2
(45) Date of Patent: Oct. 21, 2014

(54) METHOD OF MAKING CAVITY SUBSTRATE WITH BUILT-IN STIFFENER AND CAVITY SUBSTRATE MANUFACTURED THEREBY

(75) Inventors: Charles W. C. Lin, Singapore (SG); Chia Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 247 days.

(21) Appl. No.: 13/532,941

(22) Filed: Jun. 26, 2012

(65) Prior Publication Data

US 2013/0032388 A1 Feb. 7, 2013

Related U.S. Application Data

(63) Continuation-in-part of application No. 13/197,163, filed on Aug. 3, 2011, now abandoned, and a continuation-in-part of application No. 13/267,946, filed on Oct. 7, 2011, now abandoned, and a continuation-in-part of application No. 13/299,472, filed on Nov. 18, 2011, and a continuation-in-part of application No. 13/299,495, filed on Nov. 18, 2011, now Pat. No. 8,343,808, which is a continuation-in-part of application No. 13/267,946, filed on Oct. 7, 2011, now abandoned, said application No. 13/299,472 is a continuation-in-part of application No. 13/197,163, filed on Aug. 3, 2011, now abandoned.

(60) Provisional application No. 61/635,902, filed on Apr. 20, 2012, provisional application No. 61/415,862, filed on Nov. 22, 2010.

(51) Int. Cl.
| | |
|---|---|
| H05K 1/11 | (2006.01) |
| H05K 3/00 | (2006.01) |
| H01L 23/31 | (2006.01) |
| H01L 23/498 | (2006.01) |
| H01L 23/538 | (2006.01) |
| H01L 25/16 | (2006.01) |
| H01L 25/10 | (2006.01) |
| H01L 21/683 | (2006.01) |
| H01L 23/367 | (2006.01) |
| H01L 21/56 | (2006.01) |
| H01L 25/065 | (2006.01) |
| H01L 23/00 | (2006.01) |

(52) U.S. Cl.
CPC ..... *H01L 23/3121* (2013.01); *H01L 2225/1029* (2013.01); *H01L 2924/01005* (2013.01);

(Continued)

(58) Field of Classification Search
CPC ............ H01L 23/3121; H01L 23/3677; H01L 23/49827; H01L 21/56; H01L 23/5389; H01L 21/6835; H01L 21/105; H01L 25/16
USPC .............................................. 174/261; 29/829
See application file for complete search history.

(56) References Cited

U.S. PATENT DOCUMENTS 6,777,791 B2 *  8/2004  Leighton et al. .............. 257/678
7,164,198 B2    1/2007  Nakamura et al.

(Continued)

*Primary Examiner* — Walter H Swanson
(74) *Attorney, Agent, or Firm* — Bacon & Thomas, PLLC

(57) ABSTRACT

A method of making a cavity substrate. The method includes: preparing a supporting board including a stiffener, a bump/flange sacrificial carrier, an adhesive and an electrical pad, wherein the adhesive bonds the stiffener to the sacrificial carrier; forming a careless build-up circuitry on the supporting board in contact with the bump and the stiffener; and removing the bump to form a cavity and expose the electrical pad from a closed end of the cavity; wherein the cavity is laterally covered and surrounded by the adhesive. A semiconductor device can be mounted on the cavity substrate and electrically connected to the electrical pad. The careless buildup circuitry provide signal routing for the semiconductor device while the built-in stiffener can provide adequate mechanical support for the careless build-up circuitry and the semiconductor device.

20 Claims, 14 Drawing Sheets

(52) U.S. Cl.
CPC ... *H01L 2924/01082* (2013.01); *H01L 25/0655* (2013.01); *H01L 2224/83192* (2013.01); *H01L 2225/1058* (2013.01); *H01L 2924/01013* (2013.01); *H01L 2924/01079* (2013.01); H01L 23/49827 (2013.01); *H01L 2924/01023* (2013.01); *H01L 2224/83862* (2013.01); *H01L 2924/01087* (2013.01); *H01L 2224/221* (2013.01); *H01L 2224/16225* (2013.01); H01L 23/5389 (2013.01); *H01L 2225/1052* (2013.01); *H01L 2224/12105* (2013.01); *H01L 2924/01012* (2013.01); *H01L 2224/24221* (2013.01); *H01L 2224/29339* (2013.01); *H01L 2224/11849* (2013.01); *H01L 2924/01047* (2013.01); *H01L 2221/68377* (2013.01); *H01L 2924/01029* (2013.01); *H01L 2924/0001* (2013.01); *H01L 2924/01033* (2013.01); *H01L 2221/68345* (2013.01); *H01L 2924/01074* (2013.01); *H01L 2224/1146* (2013.01); *H01L 2224/2101* (2013.01); *H01L 2924/3511* (2013.01); H01L 25/16 (2013.01); *H01L 2924/0104* (2013.01); *H01L 2225/1035* (2013.01); *H01L 2224/1132* (2013.01); *H01L 2224/24101* (2013.01); H01L 25/105 (2013.01); *H01L 24/16* (2013.01); *H01L 2924/01006* (2013.01); *H01L 2924/01075* (2013.01); *H01L 2224/215* (2013.01); *H01L 2224/19* (2013.01); *H01L 2224/131* (2013.01); *H01L 2224/211* (2013.01); H01L 21/6835 (2013.01); *H01L 2924/15156* (2013.01); *H01L 2924/15311* (2013.01); *H01L 2224/04105* (2013.01); *H01L 2224/2929* (2013.01); *H01L 2924/09701* (2013.01); H01L 23/3677 (2013.01); H01L 21/56 (2013.01); *H01L 2224/82106* (2013.01)
USPC .............................. 438/118; 174/261; 29/829

(56) References Cited

U.S. PATENT DOCUMENTS

| | | |
|---|---|---|
| 7,400,035 B2 | 7/2008 | Abe et al. |
| 7,582,961 B2 | 9/2009 | Chia et al. |
| 7,872,343 B1 | 1/2011 | Berry |
| 7,934,313 B1 | 5/2011 | Lin et al. |
| 7,989,950 B2 | 8/2011 | Park et al. |
| 8,003,438 B2 * | 8/2011 | Morimoto et al. ............ 438/107 |
| 8,108,993 B2 | 2/2012 | Higashi et al. |
| 2013/0277832 A1 * | 10/2013 | LIN et al. ...................... 257/737 |

* cited by examiner

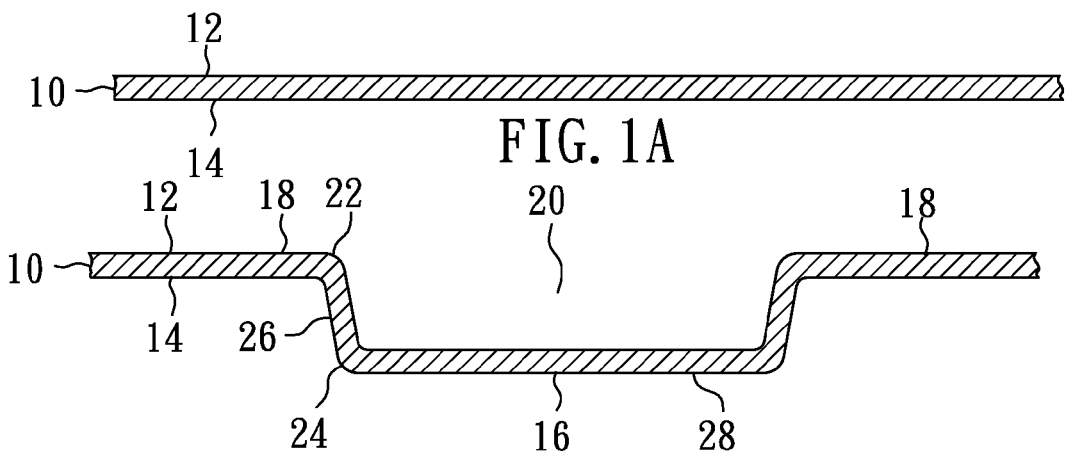
FIG. 1A
FIG. 1B
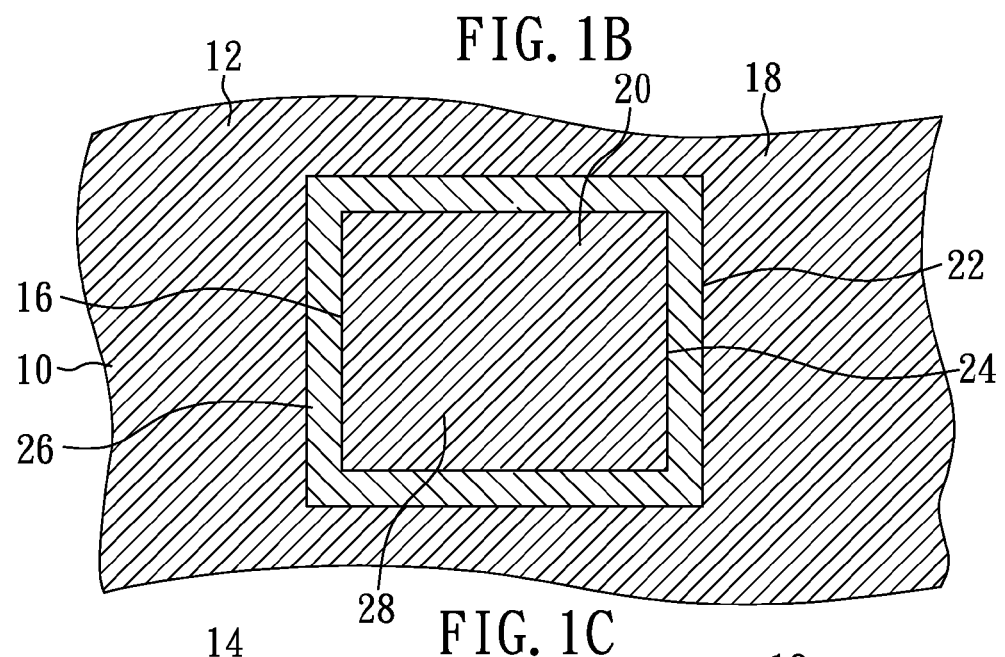
FIG. 1C
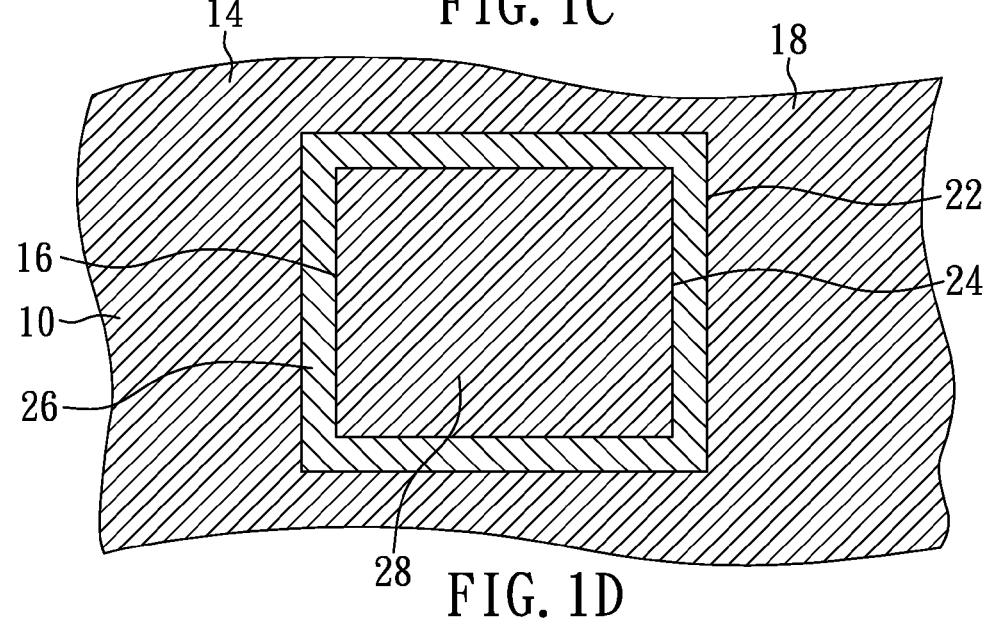
FIG. 1D

METHOD OF MAKING CAVITY SUBSTRATE WITH BUILT-IN STIFFENER AND CAVITY SUBSTRATE MANUFACTURED THEREBY

CROSS REFERENCE TO RELATED APPLICATION

This application is a continuation-in-part of U.S. application Ser. No. 13/197,163 filed Aug. 3, 2011, a continuation-in-part of U.S. application Ser. No. 13/267,946 filed Oct. 7, 2011, a continuation-in-part of U.S. application Ser. No. 13/299,472 filed Nov. 18, 2011 and a continuation-in-part of U.S. application Ser. No. 13/299,495 filed Nov. 18, 2011, each of which is incorporated by reference. This application also claims the benefit of filing date of U.S. Provisional Application Ser. No. 61/635,902 filed Apr. 20, 2012.

U.S. application Ser. No. 13/197,163 filed Aug. 3, 2011, U.S. application Ser. No. 13/267,946 filed Oct. 7, 2011, U.S. application Ser. No. 13/299,472 filed Nov. 18, 2011 and U.S. application Ser. No. 13/299,495 filed Nov. 18, 2011 all claim the benefit of filing date of U.S. Provisional Application Ser. No. 61/415,862 filed Nov. 22, 2010.

U.S. application Ser. No. 13/299,472 filed Nov. 18, 2011 is a continuation-in-part of U.S. application Ser. No. 13/197,163 filed Aug. 3, 2011. U.S. application Ser. No. 13/299,495 filed Nov. 18, 2011 is a continuation-in-part of U.S. application Ser. No. 13/267,946 filed Oct. 7, 2011.

BACKGROUND OF THE INVENTION

1. Field of the Invention

The present invention relates to a method of making a cavity substrate and a cavity substrate manufactured thereby, and more particularly to a method of making a cavity substrate with an electrical pad exposed from a cavity defined by a bump/flange sacrificial carrier and a cavity substrate manufactured thereby.

2. Description of Related Art

Latest trends of electronic devices such as mobile internet devices (MIDs), multimedia devices and computer notebooks demand for faster and slimmer designs. In the frequency band of a general signal, the shorter paths of circuitry, the better the signal integrity. Thus, the size of inter-layer connection, i.e., the diameter of the micro-via and plated through hole in the substrate must be reduced in order to improve the signal delivery characteristic of the electronic component. As plated-through-hole in the copper-clad laminate core is typically formed by mechanical CNC drill, reducing its diameter in order to increase wiring density may encounter seriously technical limitations and often very costly. As such, coreless substrates are proposed for packaging substrate to enable a thinner, lighter and faster design of the components. However, as coreless boards do not have a core layer to provide a necessary flexural rigidity, they are more susceptible to warpage problem when under thermal stress compared to that of conventional boards with core layers.

U.S. Pat. No. 7,164,198 to Nakamura et al., U.S. Pat. No. 7,400,035 to Abe et al., U.S. Pat. No. 7,582,961 to Chia et al., U.S. Pat. No. 7,934,313 to Lin et al, disclose a coreless packaging substrate with built-in stiffener by etching a portion of a metal sheet on which the build-up circuitry is formed. The built-in stiffener defines a cavity which serves as the region for semiconductor device attachment. In this approach, although a supporting platform can be created and warping issues may be improved, etching a thick metal block is prohibitively cumbersome, low throughput, and prone to create many yield-loss issues such as an uncontrollable boundary line due to etching under-cut.

U.S. Pat. No. 8,108,993 to Higashi et al. discloses a method to form built-in stiffener by using a supporting substrate on which the build-up circuitry is formed. In this approach, a peeling promotion layer is applied on the supporting substrate so that the build-up layers can be separated from the supporting substrate after the coreless wiring board is finished. Since the peeling promotion layer, either a thermal setting resin or an oxide film, has the peeling off property when under a heat or light treatment, there exists a high risk of early delamination during dielectric layer coating and curing, this may result in serious yield and reliability concerns.

In view of the various development stages and limitations in currently available coreless substrate for high I/O and high performance semiconductor devices, there is a need for a packaging board that can provide optimize signal integrity, maintain low warping during assembly and operation, and low cost manufacturing.

SUMMARY OF THE INVENTION

The present invention provides a method for making a cavity substrate that includes a build-in stiffener and a coreless build-up circuitry with an electrical pad exposed from a cavity. The method for making a cavity substrate can include: providing a supporting board that includes a sacrificial carrier, a stiffener, an adhesive and one or more electrical pads, wherein (i) the sacrificial carrier includes a bump and a flange, (ii) the bump is adjacent to and integral with the flange and extends from the flange in a first vertical direction, (iii) the flange extends laterally from the bump in lateral directions orthogonal to the first vertical direction, (iv) the stiffener is attached to the sacrificial carrier via the adhesive between the stiffener and the flange and between the stiffener and the bump, and (v) the electrical pad extends beyond the bump in the first vertical direction and is covered by the bump in a second vertical direction opposite the first vertical direction; forming a coreless build-up circuitry that covers the electrical pad, the bump and the stiffener in the first vertical direction and is electrically connected to the electrical pad; and removing the bump to form a cavity and expose the electrical pad and portion of the build-up circuitry from a closed end of the cavity, wherein the cavity is laterally covered and surrounded by the adhesive and faces in the second vertical direction.

Providing the supporting board can include: providing the sacrificial carrier that includes the bump and the flange; attaching the stiffener to the sacrificial carrier via the adhesive between the stiffener and the flange and between the stiffener and the bump, including aligning the bump with an aperture of the stiffener; and providing the electrical pad at the bump of the sacrificial carrier before or after attaching the stiffener to the sacrificial carrier via the adhesive.

The coreless build-up circuitry can include a dielectric layer, one or more via openings and one or more conductive traces. As a result, forming the coreless build-up circuitry can include: providing a dielectric layer that covers the electrical pads, the bump and the stiffener in the first vertical direction and includes one or more via openings aligned with the electrical pad and optionally with a conductive layer of the stiffener; and then providing one or more conductive traces that extend from the dielectric layer in the first vertical direction and extend laterally on the dielectric layer and extend through the via openings in the second vertical direction to the electrical pads and optionally to the conductive layer of the stiffener for grounding.

The coreless build-up circuitry can further include additional layers of dielectric, additional layers of via openings, and additional layers of conductive traces if needed for further signal routing. For instance, the coreless build-up circuitry can further include a second dielectric layer, one or more second via openings and one or more second conductive traces. As a result, forming the coreless build-up circuitry can further include: providing a second dielectric layer on the dielectric layer and the conductive trace that extends from the dielectric layer and the conductive trace in the first vertical direction and includes one or more second via openings aligned with the conductive trace; and providing one or more second conductive traces on the second dielectric layer that extend from the second dielectric layer in the first vertical direction and extends laterally on the second dielectric layer and extend through the second via openings in the second vertical direction to the conductive trace, thereby electrically connecting the conductive trace to the second conductive traces.

In accordance with one aspect of the present invention, providing the supporting board and the coreless build-up circuitry can include: providing the sacrificial carrier with the electrical pad at the bump of the sacrificial carrier; then attaching the stiffener to the sacrificial carrier via the adhesive between the stiffener and the flange and between the stiffener and the bump, including aligning the bump with the aperture of the stiffener; then providing the dielectric layer that covers the electrical pad, the bump and the stiffener in the first vertical direction; then forming the via opening in the dielectric layer, wherein the via opening is aligned with the electrical pad; then providing the conductive trace that extends from the dielectric layer in the first vertical direction and extends laterally on the dielectric layer and extends through the via opening in the second vertical direction to the electrical pad.

In accordance with another aspect of the present invention, providing the supporting board and the coreless build-up circuitry can include: providing the sacrificial carrier; then attaching the stiffener to the sacrificial carrier via the adhesive between the stiffener and the flange and between the stiffener and the bump, including aligning the bump with the aperture of the stiffener; then providing the electrical pad at the bump; then providing the dielectric layer that covers the electrical pad, the bump and the stiffener in the first vertical direction; then forming the via opening in the dielectric layer, wherein the via opening is aligned with the electrical pad; then providing the conductive trace that extends from the dielectric layer in the first vertical direction and extends laterally on the dielectric layer and extends through the via opening in the second vertical direction.

In accordance with yet another aspect of the present invention, providing the supporting board and the coreless build-up circuitry can include: providing the sacrificial carrier with the electrical pad at the bump of the sacrificial carrier; then attaching the stiffener to the sacrificial carrier via the adhesive between the stiffener and the flange and between the stiffener and the bump and simultaneously laminating the dielectric layer onto the bump, the electrical pad and the stiffener, including aligning the bump with the aperture of the stiffener; then forming the via opening in the dielectric layer, wherein the via opening is aligned with the electrical pad; then providing the conductive trace that extends from the dielectric layer in the first vertical direction and extends laterally on the dielectric layer and extends through the via opening in the second vertical direction to the electrical pad.

Attaching the stiffener to the sacrificial carrier via the adhesive can include: providing the adhesive that is non-solidified (such as a prepreg with uncured epoxy) between the flange of the sacrificial carrier and the stiffener, including aligning the bump of the sacrificial carrier with an opening of the adhesive and the aperture of the stiffener; then flowing the adhesive into a gap located in the aperture between the bump and the stiffener; and then solidifying the adhesive (such as curing the uncured epoxy).

Attaching the stiffener and simultaneously laminating the dielectric layer can include: providing the adhesive that is non-solidified and the stiffener between the flange of the sacrificial carrier and the dielectric layer, including aligning the bump with an opening of the adhesive and the aperture of the stiffener; then flowing the adhesive into a gap located in the aperture between the bump and the stiffener and compressing the dielectric layer onto the bump, the electrical pad and the stiffener; then solidifying the adhesive and the dielectric layer.

Flowing the adhesive into the gap can include: applying heat to melt the adhesive; and moving the sacrificial carrier and the stiffener towards one another, thereby moving the bump in the first vertical direction in the aperture and applying pressure to the molten adhesive between the flange and the stiffener, wherein the pressure forces the molten adhesive to flow in the first vertical direction into the gap located in the aperture between the bump and the stiffener.

Solidifying the adhesive can include applying heat to solidify the molten adhesive, thereby mechanically attaching the stiffener to the bump and the flange.

Providing the conductive trace can include depositing a plated layer on the dielectric layer that extends through the via opening to the electrical pad and optionally to a conductive layer of the stiffener, and then removing selected portions of the plated layer using an etch mask that defines the conductive trace.

Removing the bump can include chemical etching process and can be performed in any step after providing the dielectric layer that covers the electrical pad, the bump and the stiffener. Preferably, the bump is removed after all metal deposition steps are accomplished such that the bump can serve as barrier against metal deposition onto the electrical pad. In consideration of process efficiency, the bump can be simultaneously removed during patterning the plated layer. The method of making a cavity substrate according to the present invention can further include providing a plated through-hole that extends through the adhesive and the stiffener to provide an electrical connection between both sides of the cavity substrate. Specifically, the method of making a cavity substrate according to the present invention can further include providing a terminal and a plated through-hole that extends through the adhesive and the stiffener to provide an electrical connection between the terminal and the coreless build-up circuitry.

Providing the plated through-hole can include: forming a through-hole that extends through the adhesive and the stiffener in the vertical directions; and then providing a connecting layer on an inner sidewall of the through-hole.

The plated through-hole can be provided during forming the coreless build-up circuitry or after attaching the stiffener to the sacrificial carrier and before forming the coreless build-up circuitry. For instance, the method of the present invention can include: providing an inner pad that extends from the stiffener in the first vertical direction and providing the plated through-hole that extends through the adhesive and the stiffener in the vertical directions and is adjacent to the inner pad after attaching the stiffener to the sacrificial carrier; then providing the dielectric layer that covers the electrical pad, the bump, the stiffener and the inner pad in the first vertical direction; and then providing the conductive trace that extends from the dielectric layer in the first vertical direction and extends laterally on the dielectric layer and extends through the via opening and the additional via opening of the dielectric layer in the second vertical direction to the electrical pad and the inner pad. In this case, the inner pad and the connecting layer of the plated through-hole can be simultaneously deposited, and the electrical pad can be provided after depositing the inner pad and the connecting layer of the plated through-hole and before providing the dielectric layer. Alternatively, the method of the present invention can include: providing the dielectric layer that covers the electrical pad, the bump and the stiffener in the first vertical direction; then providing the conductive trace that extends from the dielectric layer in the first vertical direction and extends laterally on the dielectric layer and extends through the via opening in the second vertical direction to the electrical pad; and proving the plated through-hole that extends through the adhesive, the stiffener and one or more dielectric layers in the vertical directions and is adjacent to the conductive trace or/and an additional conductive trace. In this case, the plated through-hole can extend through the adhesive, the stiffener and one dielectric layer in the vertical directions, and the connecting layer of the plated through-hole can be provided during providing the conductive trace. Also, the plated through-hole can extend through the flange, the adhesive, the stiffener and multiple dielectric layers in the vertical directions, and the connecting layer of the plated through-hole can be provided during providing an additional conductive trace.

Accordingly, the plated though-hole at a first end can extend to and be electrically connected to an outer conductive layer of the coreless build-up circuitry and at a second end can extend to and be electrically connected to the flange. Alternatively, the plated through-hole at the first end can extend to and be electrically connected to an inner conductive layer of the coreless build-up circuitry. As another alternative, the plated through-hole at the first end can extend to and be electrically connected to an inner pad that extends from the stiffener in the first vertical direction and is spaced from the flange by the adhesive and the stiffener. In any case, the plated through-hole can extend vertically through the adhesive and the stiffener and be in an electrically conductive path between the flange and the coreless build-up circuitry.

In accordance with one embodiment of the present invention, providing the plated through-hole and the coreless build-up circuitry can include: forming the through-hole that extends through the adhesive and the stiffener in the vertical directions; then providing the connecting layer on the inner sidewall of the through-hole; providing the inner pad that extends from the stiffener in the first vertical direction and is adjacent to the connecting layer; then providing the dielectric layer that covers the electrical pad, the bump, the stiffener and the inner pad in the first vertical direction; then forming the via opening and an additional via opening in the dielectric layer, wherein the via opening is aligned with the electrical pad and the additional via opening is aligned with the inner pad; and then providing the conductive trace that extends from the dielectric layer in the first vertical direction and extends laterally on the dielectric layer and extends through the via opening and the additional via opening in the second vertical direction to the electrical pad and the inner pad.

In accordance with another embodiment of the present invention, providing the plated through-hole and the coreless build-up circuitry can include: providing the dielectric layer that covers the electrical pad, the bump and the stiffener in the first vertical direction; then forming the via opening in the dielectric layer, wherein the via opening is aligned with the electrical pad; forming the through-hole that extends through the adhesive, the stiffener and the dielectric layer in the vertical directions; providing the connecting layer on the inner sidewall of the through-hole; and providing the conductive trace that extends from the dielectric layer in the first vertical direction and extends laterally on the dielectric layer and extends through the via opening in the second vertical direction to the electrical pad.

Providing the terminal can include removing a selected portion of the flange. That is, the terminal can be a remaining portion of the flange and adjacent to the plated through-hole and extend from the adhesive in the second vertical direction. In consideration of process efficiency, the terminal can be simultaneously defined during removal of the bump. That is, removing the bump can include simultaneously removing a selected portion of the flange to define the terminal.

Providing the inner pad can include: depositing an inner plated layer on the bump, the adhesive and the stiffener in the first vertical direction; then removing a selected portion of the inner plated layer to define the inner pad. After depositing the inner plated layer, the electrical pad can be provided on the inner plated layer on the bump.

The dielectric layers can be deposited and extend to peripheral edges of the assembly by numerous techniques including film lamination, roll coating, spin coating and spray-on deposition. The via openings can be formed through the dielectric layers by numerous techniques including laser drilling, plasma etching and photolithography. The through-hole can be formed by numerous techniques including mechanical drilling, laser drilling and plasma etching with or without wet etching. The plated layers and connecting layer can be deposited by numerous techniques including electroplating, electroless plating, evaporating, sputtering, and their combinations as a single layer or multiple layers. The plated layers can be patterned by numerous techniques including wet etching, electro-chemical etching, laser-assist etching, and their combinations to define the conductive traces.

The bump and the flange of the sacrificial carrier can be integral with each other and can be made of any material with good processability and good removability. For instance, the bump and the flange can be a single-piece metal or include a single-piece metal at their interface, and the single-piece metal can be copper, aluminum, nickel, iron, tin or their alloys. Moreover, the bump and the flange can be formed by a mechanical stamping process. For instance, providing the sacrificial carrier with the bump and the flange can include mechanically stamping a metal plate. The sacrificial carrier can further include a stamped cavity in the bump and the stamped cavity in the bump faces in the second vertical direction and is covered by the bump in the first vertical direction. The bump and the cavity in the bump can be a stamped portion of the metal plate and the flange can be an unstamped portion of the metal plate.

The bump can have a larger diameter or dimension in the second vertical direction than in the first vertical direction. For instance, the bump can have a cut-off conical or pyramidal shape in which its diameter or dimension decreases as it extends in the first vertical direction from the flange. Accordingly, as the adhesive extends into the gap between the bump and the stiffener in the first vertical direction, the adhesive can have an increasing thickness where it is adjacent to the bump. The bump can also have a cylindrical shape with a constant diameter. Accordingly, the adhesive can have a constant thickness in the gap between the bump and the stiffener.

The cavity in the bump can have a larger diameter or dimension at its entrance than at its floor. For instance, the stamped cavity can have a cut-off conical or pyramidal shape in which its diameter or dimension increases as it extends in the second vertical direction from its floor to its entrance. Alternatively, the stamped cavity can have a cylindrical shape with a constant diameter. The stamped cavity can also have a circular, square or rectangular periphery at its entrance and its floor. The stamped cavity can also conform to the shape of the bump, extend into the opening and the aperture and extend across most of the bump in the vertical and lateral directions.

The adhesive between the flange and the stiffener can flow into a gap located in the aperture between the bump and the stiffener, as above mentioned. Accordingly, the adhesive can contact the bump, the flange and the stiffener, extend laterally from the hump to peripheral edges of the cavity substrate and have a first thickness (in the vertical directions) where it is adjacent to the flange and a second thickness (in the lateral directions) where it is adjacent to the bump that is different from the first thickness.

The sacrificial carrier may be entirely removed. However, if is preferable to reserve selected portions of the flange as a supporting platform for a heat sink attached thereon. Furthermore, the flange also can be processed into a terminal that is electrically connected to the build-up circuitry through the plated through-hole and can be used for grounding or serve as an electrical contact for the next level assembly or another electronic device.

The electrical pad can be made of any stable material against etching during removal of the bump. For instance, the electrical pads may be gold pads in the case of the sacrificial carrier being made of copper. Alternatively, the supporting board can further include a barrier layer between the electrical pad and the bump. For instance, the sacrificial carrier can further include a barrier layer such as Sn layer that covers the bump in the first vertical direction, such that the barrier layer can protect the electrical pad from etching during removal of the bump even the electrical pad being made of the same material as the bump. The barrier layer can be made of any material that can be effectively removed without damage on the electrical pad. However, even though no barrier layer is applied or the electrical pad is not made of an anti-etching material as above mentioned, the outcome of the electrical pad being slightly etched during removal of the bump is also acceptable and even better.

By the above-mentioned method, the present invention can provide a cavity substrate that includes a cavity, an adhesive, a stiffener, an electrical pad and a coreless build-up circuitry, wherein (i) the cavity has a closed end in the first vertical direction and an open end in the second vertical direction; (ii) the stiffener includes an aperture, wherein the cavity extends into the aperture; (iii) the adhesive laterally covers and surrounds and conformally coats a sidewall of the cavity, extends laterally from the cavity to peripheral edges of the substrate and covers and contacts the stiffener in the second vertical direction; (iv) the electrical pad extends from the closed end of the cavity in the first vertical direction; and (v) the coreless build-up circuitry covers the electrical pad, the closed end of the cavity and adhesive in the first vertical direction and is coplanar with or higher than the electrical pad at the closed end of the cavity and is electrically connected to the electrical pad.

The stiffener can extend to peripheral edges of the cavity substrate to provide mechanical support for the coreless build-up circuitry and can be made of organic materials such as copper-clad laminate. The stiffener can also be made of inorganic materials such as aluminum oxide ($Al_2O_3$), aluminum nitride (AlN), silicon nitride (SiN), silicon (Si), copper (Cu), aluminum (Al), stainless steel, etc. Alternatively, the stiffener can be a single layer structure or a multi-layer structure such as a circuit board or a multi-layer ceramic board or a laminate of a substrate and a conductive layer.

The adhesive can extend to peripheral edges of the cavity substrate and the mechanical rigidity of the cured adhesive also can provide mechanical support for the coreless build-up circuitry. Additionally, the adhesive can cover the stiffener in the second vertical direction and extend into the aperture of the stiffener and conformally coat the sidewall of the cavity. Accordingly, the adhesive can have a first thickness where it is adjacent to the sidewall of the cavity and a second thickness where it covers the stiffener in the second vertical direction that is different from the first thickness. The adhesive can be made of the materials that are at least one selected from the group consisting of epoxy resin, bismaleimide triazine (BT), benzocyclobutene (BCB), Ajinomoto build-up film (ABF), liquid crystal polymer, polyimide, poly(phenylene ether), poly(tetrafluorothylene), aramide and glass fiber.

The cavity substrate provided by the present invention can further include: a terminal that extends beyond the adhesive in the second vertical direction and is spaced from the coreless build-up circuitry by the adhesive and the stiffener; and a plated through-hole that extends through the adhesive and the stiffener to provide an electrical connection between the coreless build-up circuitry and the terminal.

The coreless build-up circuitry can extend from, contact and cover the closed end, the electrical pad, the adhesive and the stiffener in the first vertical direction. Furthermore, the coreless build-up circuitry can include one or more interconnect pads that are defined from selected portions of outer conductive traces and electrically connected to the electrical pad and extend from a dielectric layer in the first vertical direction and include an exposed contact surface that faces in the first vertical direction to provide an electrical contact for the next level assembly or another electronic device such as a semiconductor chip, a plastic package or another semiconductor assembly. Likewise, the terminal can include an exposed contact surface that faces in the second vertical direction as another electrical contact for the next level assembly or another electronic device. As a result, the cavity substrate includes electrical contacts that are electrically connected to one another and located on opposite surfaces that face in opposite vertical directions so that the cavity substrate is stackable.

The present invention also provides a semiconductor assembly in which a semiconductor device can extend into the cavity defined in the adhesive and be electrically connected to the electrical pads in the cavity using a wide variety of connection media including gold or solder bumps or bonding wires. Optionally, an under-fill can be dispensed within the cavity and a heat sink may be attached on the semiconductor device to enhance thermal performance.

Moreover, the present invention further provides a three-dimensional stacking structure where plural stackable semiconductor assemblies each with a semiconductor device embedded in the cavity are stacked using a wide variety of connection media. For instance, the assemblies can be face-to-back vertically stacked using solder balls between the terminal of the bottom assembly and the interconnect pad of the top assembly.

The semiconductor device can be a packaged or unpackaged semiconductor chip. For instance, the semiconductor device can be a land grid array (LGA) package or wafer level package (WLP) that includes a semiconductor chip or an assembly with chips on an interposer. Alternatively, the semiconductor device can be a semiconductor chip.

The assembly can be a first-level or second-level single-chip or multi-chip device. For instance, the assembly can be a first-level package that contains a single chip or multiple chips. Alternatively, the assembly can be a second-level module that contains a single package or multiple packages, and each package can contain a single chip or multiple chips.

Unless specific descriptions or using the term "then" between steps or steps necessarily occurring in a certain order, the sequence of the above-mentioned steps is not limited to that set forth above and may be changed or reordered according to desired design.

The present invention has numerous advantages. The supporting board which contains a stiffener provides a flat and stable platform for forming the coreless build-up circuitry and thus make the manufacturing process easy to handle. The bump of the sacrificial carrier which defines a cavity area for device placement can only be separated from the build-up circuitry by etching thus ensure a high manufacturing yield without un-predictable peeling or delamination concern. Furthermore, vast options of the built-in stiffener ranging from low coefficient of thermal expansion (CTE) materials like ceramics, to high thermal conductive materials like metal plate, to low cost materials like glass-fiber epoxy provide diversified solutions for various packaging designs. As a result, a semiconductor device can be mounted into the cavity without special alignment tool to achieve low profile and small form-factor requirements. The electrical connection between the semiconductor device and the build-up circuitry can be successfully established through the well-defined electrical pads at the cavity without the troublesome matter that the lamination-induced displacement and warping which often cause the failure of semiconductoor package. The plated through-hole can provide vertical signal routing between the build-up circuitry and the terminal, thereby providing the cavity substrate with stacking capability.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which:

FIGS. 1A and 1B are cross-sectional views showing a bump and a flange in accordance with an embodiment of the present invention;

FIGS. 1C and 1D are top and bottom views, respectively, corresponding to FIG. 1B;

DETAILED DESCRIPTION OF THE PREFERRED EMBODIMENT

Embodiment 1

Figure 2A:
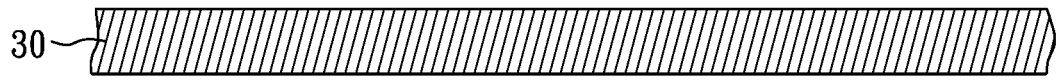
FIGS. 2A and 2B are cross-sectional views showing an adhesive in accordance with an embodiment of the present invention.

FIGS. 1A and 1B are cross-sectional views showing a method of making a sacrificial carrier with a bump and a flange in accordance with an embodiment of the present invention, and FIGS. 1C and 1D are top and bottom views, respectively, corresponding to FIG. 1B.

FIG. 1A. is a cross-sectional view of sacrificial carrier 10 which is a metal plate and includes opposing major surfaces 12 and 14. Sacrificial carrier 10 is illustrated as a copper plate with a thickness of 200 microns. Copper has good flexibility and low cost. Sacrificial carrier 10 can be various metals such as copper, aluminum, alloy 42, iron, nickel, silver, gold, tin, combinations thereof, and alloys thereof.

FIGS. 1B, 1C and 1D are cross-sectional, top and bottom views, respectively, of sacrificial carrier 10 with bump 16, flange 18 and cavity 20. Bump 16 and stamped cavity 20 are formed by mechanically stamping of sacrificial carrier 10. Thus, bump 16 is a stamped portion of sacrificial carrier 10 and flange 18 is an unstamped portion of sacrificial carrier 10.

Bump 16 is adjacent to and integral with flange 18 and extends from flange 18 in the downward direction. Bump 16 includes bent corners 22 and 24, tapered sidewall 26 and floor 28. Bent corners 22 and 24 are bent by the stamping operation. Bent corner 22 is adjacent to flange 18 and tapered sidewall 26 and bent corner 24 is adjacent to tapered sidewall 26 and floor 28. Tapered sidewall 26 extends outwardly as it extends in the upward direction and floor 28 extends laterally in lateral directions (such as left and right) orthogonal to the upward and downward directions. Thus, bump 16 has a cut-off pyramidal shape (resembling a frustum) in which its diameter decreases as it extends downwardly from flange 18 to floor 28 and increases as it extends upwardly from floor 28 to flange 18. Bump 16 has a height of 300 microns relative to flange 18, a dimension of 10.5 mm by 8.5 mm at flange 18 and a dimension of 10.25 mm by 8.25 mm at floor 28. Furthermore, bump 16 has an irregular thickness due to the stamping operation. For instance, tapered sidewall 26 is thinner than floor 28 since it is elongated by the stamping operation. Bump 16 is shown with a uniform thickness for convenience of illustration.

Flange 18 extends laterally from bump 16 in the lateral directions, is flat and has a thickness of 200 microns.

Stamped cavity 20 faces in the upward direction, extends into bump 16, is covered by bump 16 in the downward direction and has an entrance at flange 18. Stamped cavity 20 also conforms to the shape of bump 16. Thus, stamped cavity 20 has a cut-off pyramidal shape (resembling a frustum) in which its diameter decreases as it extends downwardly from its entrance at flange 18 to floor 28 and increases as it extends upwardly from floor 28 to its entrance at flange 18. Furthermore, stamped cavity 20 extends across most of bump 16 in the vertical and lateral directions and has a depth of 300 microns.

Figure 2B:
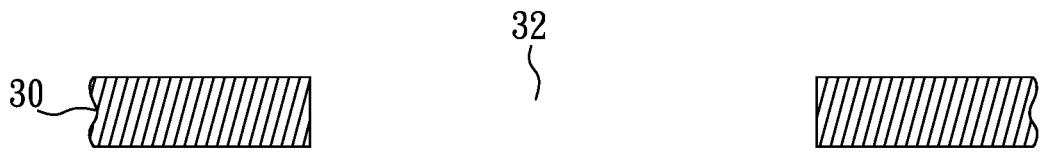
Figure 2C:
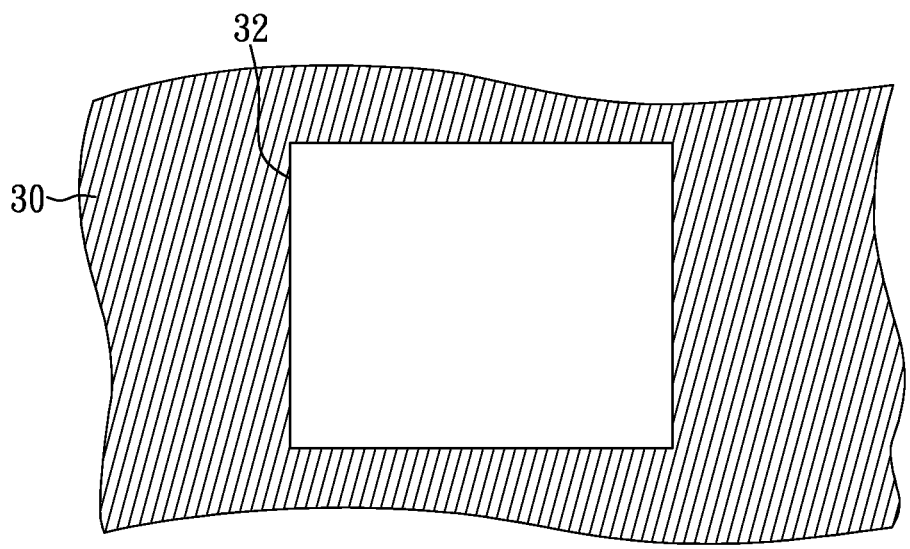
FIGS. 2C and 2D are top and bottom views, respectively, corresponding to FIG. 2B.
Figure 2D:
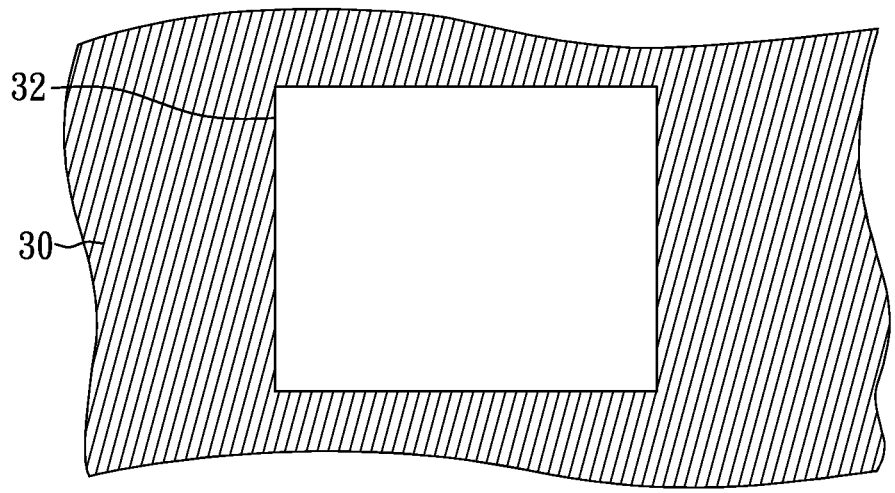

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 30. Adhesive 30 is illustrated as a prepreg with B-stage uncured epoxy provided as a non-solidified un-patterned sheet with a thickness of 150 microns.

Adhesive 30 can be various dielectric films or prepregs formed from numerous organic or inorganic electrical insulators. For instance, adhesive 30 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARDCprepreg by W.L. Gore & Associates of Eau Claire, Wis. are suitable.

FIGS. 2B, 2C and 2D are cross-sectional, top and bottom views, respectively, of adhesive 30 with opening 32. Opening 32 is a window that extends through adhesive 30 and has a dimension of 10.55 mm by 8.55 mm. Opening 32 is formed by punching through the prepreg and can be formed by other techniques such as laser cutting.

Figure 3A:
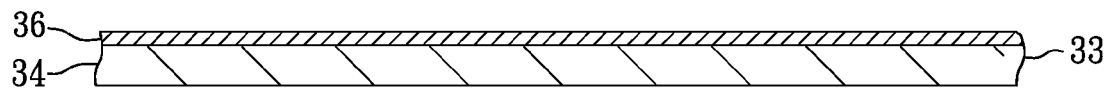
FIGS. 3A and 3B are cross-sectional views showing a stiffener including a substrate and a conductive layer in accordance with an embodiment of the present invention.
Figure 3B:
Figure 3C:
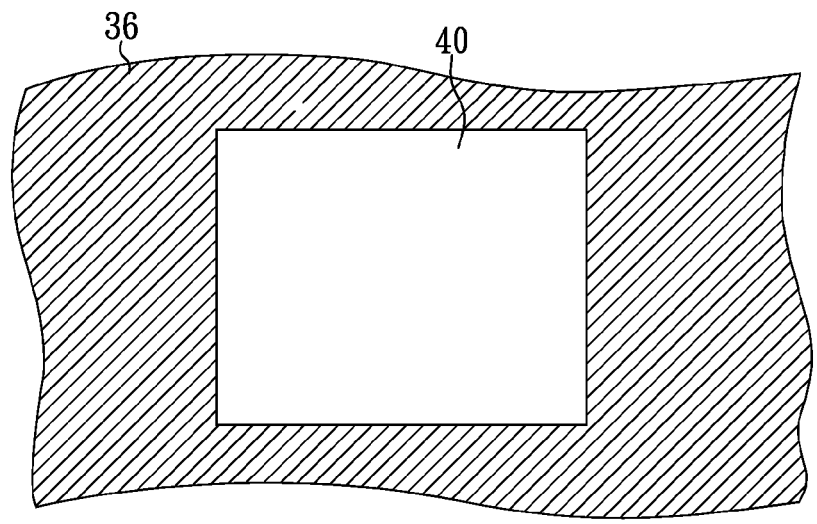
FIGS. 3C and 3D are top and bottom views, respectively, corresponding to FIG. 3B.
Figure 3D:
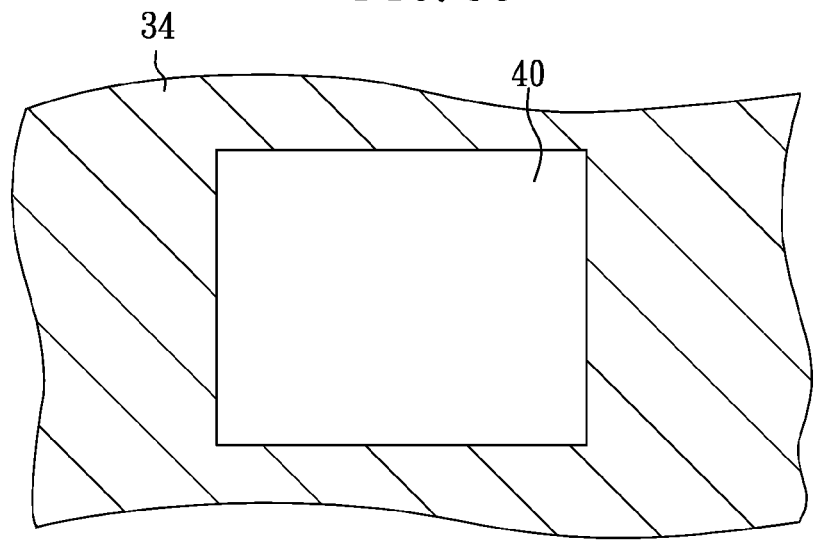

FIGS. 3A and 3B are cross-sectional views showing a method of making a stiffener in accordance with an embodiment of the present invention, and FIGS. 3C and 3D are top and bottom views, respectively, corresponding to FIG. 3B.

FIG. 3A is a cross-sectional view of stiffener 33 that includes substrate 34 and conductive layer 36. For instance, substrate 34 is a glass-epoxy material with a thickness of 150 microns and conductive layer 36 that contacts and extends above and is laminated to substrate 34 is an unpatterned copper sheet with a thickness of 30 microns.

FIGS. 3B, 3C and 3D are cross-sectional, top and bottom views, respectively, of stiffener 33 with an aperture 40. Aperture 40 is a window that extends through stiffener 33 and has a dimension of 10.55 min by 8.55 min. Aperture 40 is formed by punching through substrate 34 and conductive layer 36 and can be formed with other techniques such as laser cutting with or without wet etching. Thus, opening 32 and aperture 40 have the same dimension. Furthermore, opening 32 and aperture 40 can be formed in the same manner with the same punch at the same punching station.

Substrate 34 is illustrated as a single layer dielectric structure. Stiffener 33 can also be an electrical interconnect such as a multi-layer printed circuit board or a multi-layer ceramic board. Accordingly, stiffener 33 can include embedded circuitry.

Figure 4A:
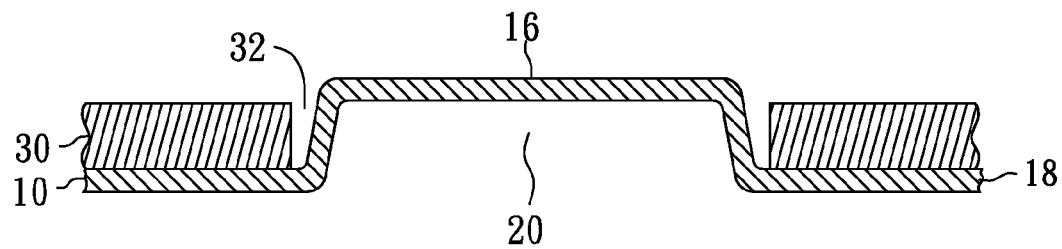
FIGS. 4A-4G are cross-sectional views showing a method of making a supporting board in accordance with an embodiment of the present invention.
Figure 4B:
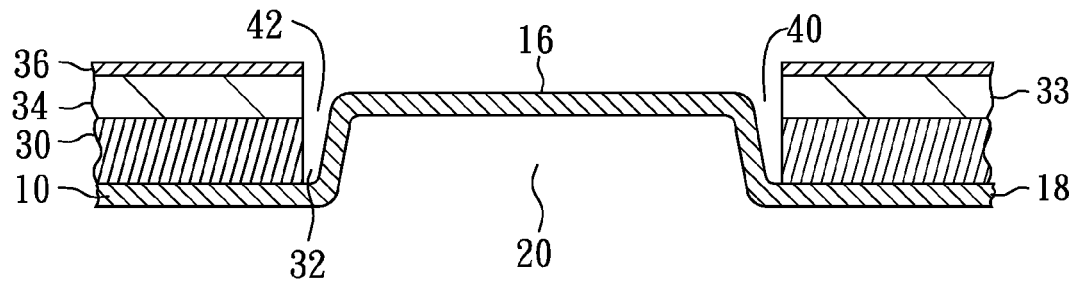
Figure 4C:
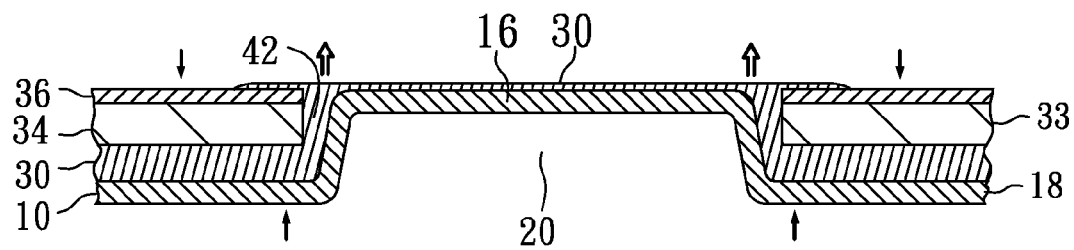
Figure 4D:
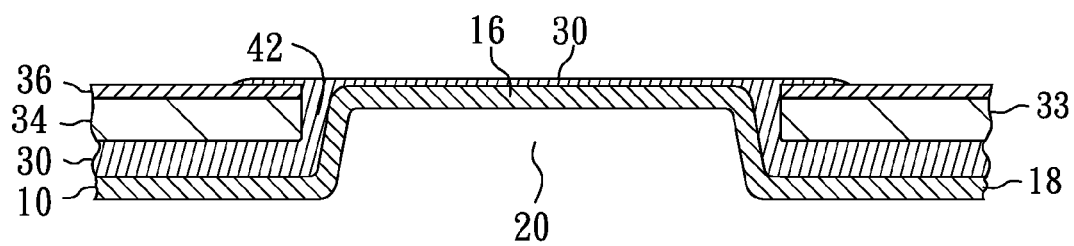
Figure 4E:
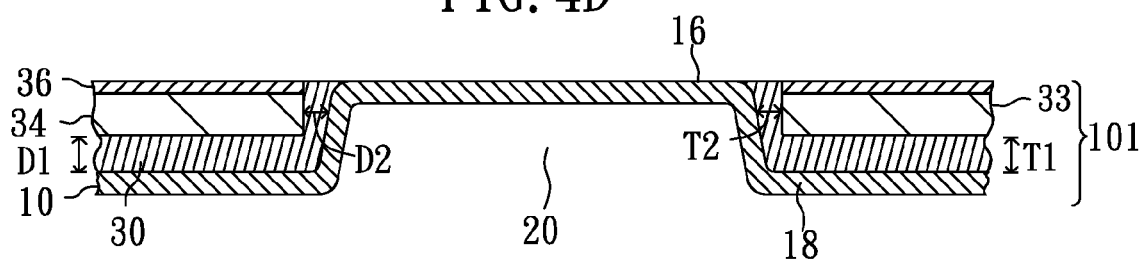
Figure 4F:
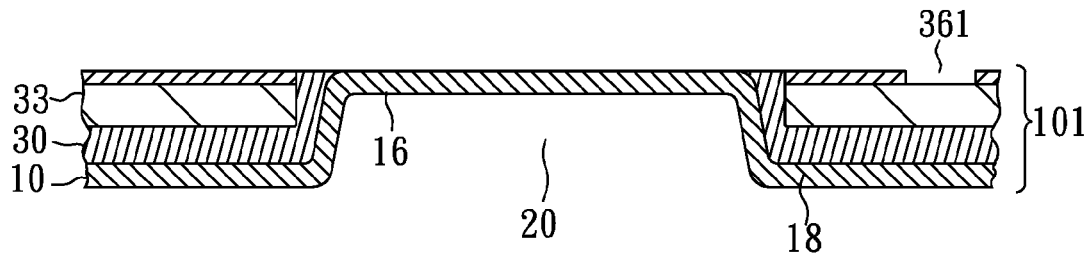
Figure 4G:
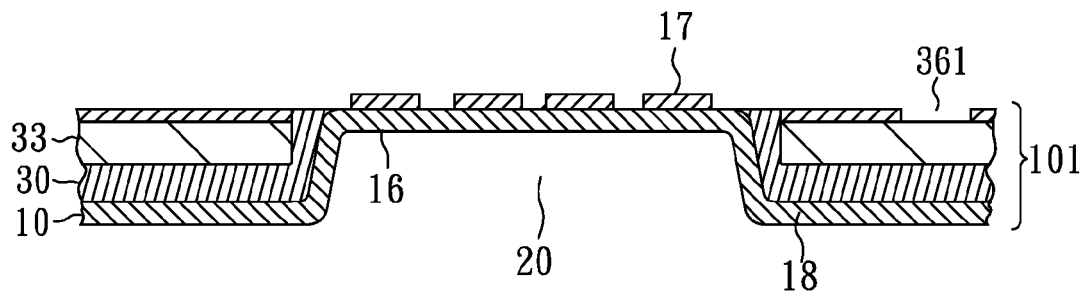

FIGS. 4A-4G are cross-sectional views showing a method of making a supporting board, as shown in FIG. 4G, that includes sacrificial carrier 10, adhesive 30, stiffener 33 and electrical pads 17 in accordance with an embodiment of the present invention.

In FIGS. 4A and 4B the structure is inverted to a cavity-down position so that gravity assists with mounting adhesive 30 and stiffener 33 on flange 18 and in FIGS. 4C-5G the structure remains in the cavity-down position. Thereafter, in FIGS. 5H-5I the structure is inverted again to the cavity-up position as in FIGS. 1A-1D. Thus, stamped cavity 20 faces downward in FIGS. 4A-5G and upward in FIGS. 5H-5I. However, the relative orientation of the structure does not change. Stamped cavity 20 faces in the second vertical direction and is covered by bump 16 in the first vertical direction regardless of whether the structure is inverted, rotated or slanted. Likewise, bump 16 extends beyond stiffener 33 in the second vertical direction and extends from flange 18 in the first vertical direction regardless of whether the structure is inverted, rotated or slanted. Hence, the first and second vertical directions are oriented relative to the structure and remain opposite to one another and orthogonal to the lateral directions.

FIG. 44 is a cross-sectional view of the structure with adhesive 30 mounted on flange 18. Adhesive 30 is mounted by lowering it onto flange 18 as bump 16 is inserted into and through and upwards in opening 32. Adhesive 30 eventually contacts and rests on flange 18. Preferably, bump 16 is inserted into and extends through opening 32 without contacting adhesive 30 and is aligned with and centrally located within opening 32.

FIG. 4B is a cross-sectional view of the structure with stiffener 33 mounted on adhesive 30. Stiffener 33 is mounted by lowering it onto adhesive 30 as bump 16 is inserted into and upwards in aperture 40. Stiffener 33 eventually contacts and rests on adhesive 30.

Bump 16 is inserted into but not through aperture 40 without contacting stiffener 33 and is aligned with and centrally located within aperture 40. As a result, gap 42 is located in aperture 40 between bump 16 and stiffener 33. Gap 42 laterally surrounds bump 16 and is laterally surrounded by stiffener 33. In addition, opening 32 and aperture 40 are precisely aligned with one another and have the same dimension.

At this stage, stiffener 33 is mounted on and contacts and extends above adhesive 30. Bump 16 extends through opening 32 into aperture 40, is 30 microns below the top surface of conductive layer 36 and is exposed through aperture 40 in the upward direction. Adhesive 30 contacts and is sandwiched between flange 18 and substrate 34, contacts substrate 34 but is spaced from conductive layer 36 and remains a non-solidified prepreg with B-stage uncured epoxy, and gap 42 is filled with air.

FIG. 4C is a cross-sectional view of the structure with adhesive 30 in gap 42. Adhesive 30 is flowed into gap 42 by applying heat and pressure. In this illustration, adhesive 30 is forced into gap 42 by applying downward pressure to conductive layer 36 and/or upward pressure to flange 18, thereby moving flange 18 and stiffener 33 towards one another and applying pressure to adhesive 30 while simultaneously applying heat to adhesive 30. Adhesive 30 becomes compliant enough under the heat and pressure to conform to virtually any shape. As a result, adhesive 30 sandwiched between flange 18 and stiffener 33 is compressed, forced out of its original shape and flows into and upward in gap 42. Flange 18 and stiffener 33 continue to move towards one another and adhesive 30 eventually fills gap 42. Moreover, adhesive 30 remains sandwiched between and continues to fill the reduced space between flange 18 and stiffener 33.

For instance, flange 18 and conductive layer 36 can be disposed between top and bottom platens (not shown) of a press. In addition, a top cull plate and top buffer paper (not shown) can be sandwiched between conductive layer 36 and the top platen, and a bottom cull plate and bottom buffer paper (not shown) can be sandwiched between flange 18 and the bottom platen. The stack includes the top platen, top cull plate, top buffer paper, substrate 34 and conductive layer 36, adhesive 30, flange 18, bottom buffer paper, bottom cull plate and bottom platen in descending order. Furthermore, the stack may be positioned on the bottom platen by tooling pins (not shown) that extend upward from the bottom platen through registration holes (not shown) in flange 18.

The platens are heated and move towards one another, thereby applying heat and pressure to adhesive 30. The cull plates disperse the heat from the platens so that it is more uniformly applied to flange 18 and stiffener 33 and thus adhesive 30, and the buffer papers disperse the pressure from the platens so that it is more uniformly applied to flange 18 and stiffener 33 and thus adhesive 30. Initially, stiffener 33 contacts and presses down on adhesive 30. As the platen motion and heat continue, adhesive 30 between flange 18 and stiffener 33 is compressed, melted and flows into and upward in gap 42 and across substrate 34 to conductive layer 36. For instance, the uncured epoxy is melted by the heat and the molten uncured epoxy is squeezed by the pressure into gap 42, however the reinforcement and the filler remain between flange 18 and stiffener 33. Adhesive 30 elevates more rapidly than bump 16 in aperture 40 and fills gap 42. Adhesive 30 also rises slightly above aperture 40 and overflows onto the top surfaces of bump 16 and conductive layer 6 before the platen motion stops. This may occur due to the prepreg being slightly thicker than necessary. As a result, adhesive 30 creates a thin coating on the top surfaces of bump 16 and conductive layer 36. The platen motion is eventually blocked by bump 16 and the platens become stationary but continue to apply heat to adhesive 30.

The upward flow of adhesive 30 in gap 42 is shown by the thick upward arrows, the upward motion of bump 16 and flange 18 relative to stiffener 33 is shown by the thin upward arrows, and the downward motion of stiffener 33 relative to bump 16 and flange 18 is shown by the thin downward arrows.

FIG. 4D is a cross-sectional view of the structure with adhesive 30 solidified.

For instance, the platens continue to clamp bump 16 and flange 18 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 30 as solidified provides a secure robust mechanical bond between bump 16 and stiffener 33 and between flange 18 and stiffener 33. Adhesive 30 can withstand normal operating pressure without distortion or damage and is only temporarily distorted under unusually high pressure. Furthermore, adhesive 30 can absorb thermal expansion mismatch between bump 16 and stiffener 33 and between flange 18 and stiffener 33.

At this stage, bump 16 and conductive layer 36 are essentially coplanar with one another and adhesive 30 and conductive layer 36 extend to a top surface that faces in the upward direction. For instance, adhesive 30 between flange 18 and stiffener 33 has a thickness of 120 microns which is 30 microns less than its initial thickness of 150 microns, bump 16 ascends 30 microns in aperture 40 and stiffener 33 descends 30 microns relative to bump 16. The 300 micron height of bump 16 is essentially the same as the combined height of conductive layer 36 (30 microns), substrate 34 (150 microns) and the underlying adhesive 30 (120 microns). Furthermore, bump 16 continues to be centrally located in opening 32 and aperture 40 and spaced from stiffener 33 and adhesive 30 fills the space between flange 18 and stiffener 33 and fills gap 42. Adhesive 30 extends across stiffener 33 in gap 42. That is, adhesive 30 in gap 42 extends in the upward and downward directions across the thickness of stiffener 33 at the outer sidewall of gap 42. Adhesive 30 also includes a thin top portion above gap 42 that contacts the top surfaces of bump 16 and conductive layer 36 and extends above bump 16 by 10 microns.

FIG. 4E is a cross-sectional view of the structure after upper portions of bump 16, adhesive 30 and conductive layer 36 are removed by grinding. For instance, a rotating diamond sand wheel and distilled water are applied to the top of the structure. Initially, the diamond sand wheel grinds only adhesive 30. As the grinding continues, adhesive 30 becomes thinner as its grinded surface migrates downwardly. Eventually the diamond sand wheel contacts bump 16 and conductive layer 36 (not necessarily at the same time), and as a result, begins to grind bump 16 and conductive layer 36 as well. As the grinding continues, bump 16, adhesive 30 and conductive layer 36 become thinner as their grinded surfaces migrate downwardly. The grinding continues until the desired thickness has been removed. Thereafter, the structure is rinsed in distilled water to remove contaminants.

The grinding removes a 20 micron thick upper portion of adhesive 30, a 10 micron thick upper portion of bump 16 and a 10 micron thick upper portion of conductive layer 36. The decreased thickness does not appreciably affect bump 16 or adhesive 30. However, it substantially reduces the thickness of conductive layer 36 from 30 microns to 20 microns. After the grinding, bump 16, adhesive 30 and conductive layer 36 are coplanar with one another at a smoothed lapped lateral top surface that is above substrate 34 and faces in the upward direction.

At this stage, as shown in FIG. 4E, supporting board 101 includes sacrificial carrier 10, adhesive 30 and stiffener 33. Sacrificial carrier 10 includes bump 16 and flange 18. Bump 16 is adjacent to flange 18 at bent corner 22, extends from flange 18 in the upward direction and is integral with flange 18. Bump 16 extends into and remains centrally located within opening 32 and aperture 40, and is coplanar at its top with an adjacent portion of adhesive 30. Bump 16 is spaced from stiffener 33 and retains its cut-off pyramidal shape in which its dimension increases as it extends downwardly.

Stamped cavity 20 faces in the downward direction, extends into remains centrally located within bump 16, opening 32 and aperture 40 and is covered by bump 16 in the upward direction. Stamped cavity 20 conforms to the shape of bump 16, extends across most of bump 16 in the vertical and lateral directions and retains its cut-off pyramidal shape in which its dimension decreases as it extends upwardly from its entrance at flange 18.

Flange 18 extends laterally from bump 16, extends below adhesive 30, stiffener 33, opening 32 and aperture 40, contacts adhesive 30 and is spaced from stiffener 33.

Adhesive 30 contacts and is sandwiched between and fills the space between bump 16 and stiffener 33 in gap 42 and contacts stiffener 33 and flange 18 outside gap 42. Adhesive 30 covers and surrounds tapered sidewall 26 of bump 16 in the lateral directions, extends laterally from bump 16 to peripheral edges of the assembly and is solidified. Accordingly, adhesive 30 has first thickness T1 where it is adjacent to flange 18 and second thickness T2 where it is adjacent to bump 16 that is different from first thickness T1. That is, distance D1 in the vertical directions between flange 18 and stiffener 33 is different from distance D2 in the lateral directions between bump 16 and stiffener 33. Furthermore, as adhesive 30 extends away from flange 18 into gap 42 between bump 16 and stiffener 33, adhesive 30 can have an increasing thickness where it is adjacent to bump 16 owing to that bump 16 has an increasing dimension as it extends towards flange 18.

Supporting board 101 with multiple bumps can be accomplished by stamping sacrificial carrier 10 to include additional bumps 16, adjusting adhesive 30 to include additional openings 32 and adjusting stiffener 33 to include additional apertures 40.

Subsequently, as shown in FIG. 4F, opening 36 is formed through conductive layer 36 at predetermined locations for subsequent formation of plated through-holes.

FIG. 4G is a cross-sectional view of the structure showing electrical pads 17 formed on sacrificial carrier 10 at bump 16. Electrical pads 17 extend from bump 16 in the upward direction and are covered by bump 16 in the downward direction. Electrical pads 17 can be pattern deposited by numerous techniques including electroplating, electroless plating, evaporating, sputtering and their combinations or thin-film deposited followed by etching. Electrical pads 17 are illustrated as gold pads but also can be made of other various stable materials against etching during removal of bump 16. In this illustration, electrical pads 17 are deposited after attaching stiffener 33 to sacrificial carrier 10, but it is also possible to deposit electrical pads 17 before forming hump 16 and cavity 20. FIGS. 5A-5I are cross-sectional views showing a method of making a cavity substrate that includes a supporting board with electrical pads exposed from a cavity, a coreless build-up circuitry in electrical connection with the electrical pads, and a plated through-hole that provides an electrical connection between both sides of the cavity substrate in accordance with an embodiment of the present invention.

Figure 5A:
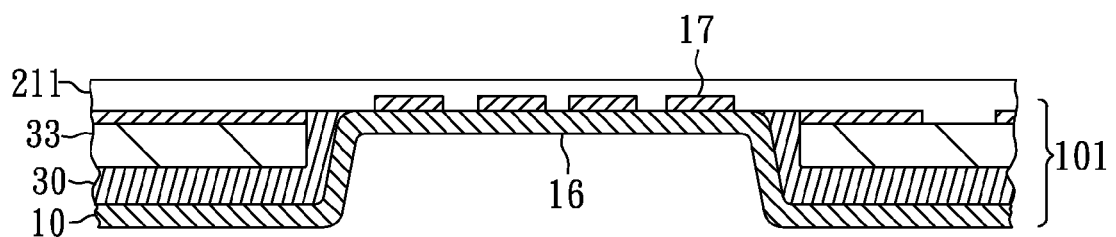
FIGS. 5A-5I are cross-sectional views showing a method of making a cavity substrate that includes a supporting board with electrical pads exposed from a cavity defined in an adhesive, a coreless build-up circuitry in electrical connection with the electrical pads and a plated through-hole in accordance with an embodiment of the present invention.
Figure 5B:
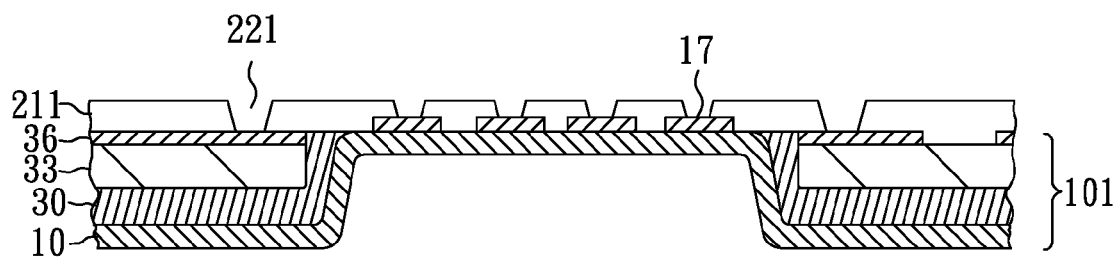
Figure 5C:
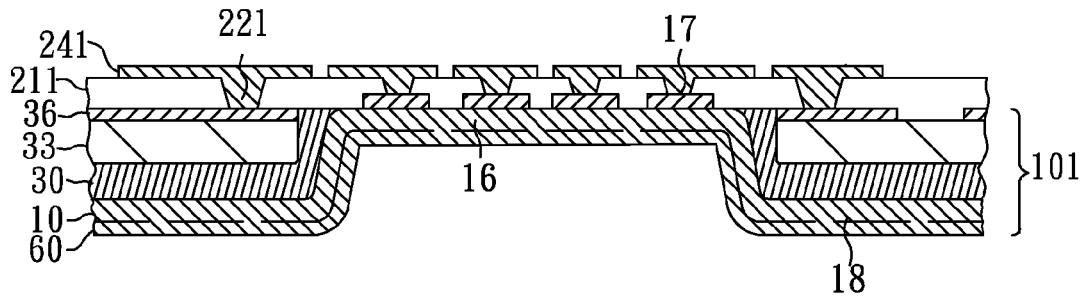
Figure 5D:
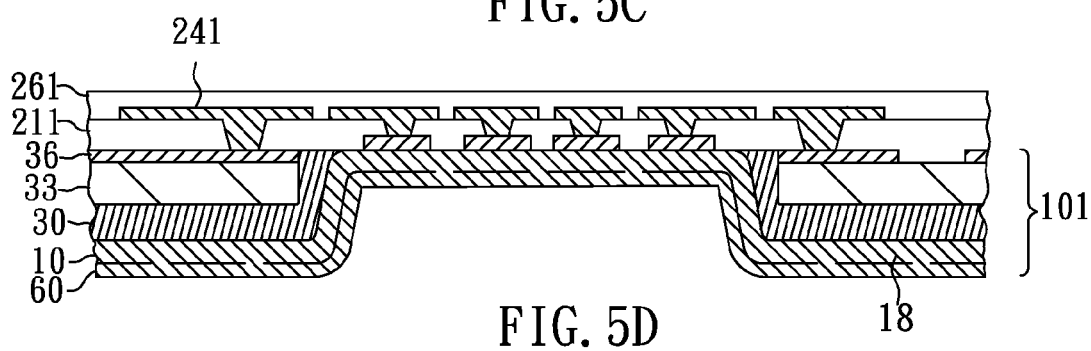
Figure 5E:
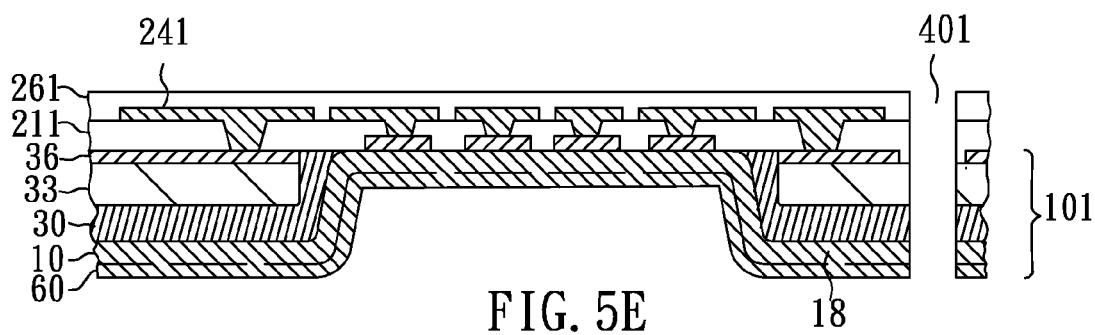
Figure 5F:
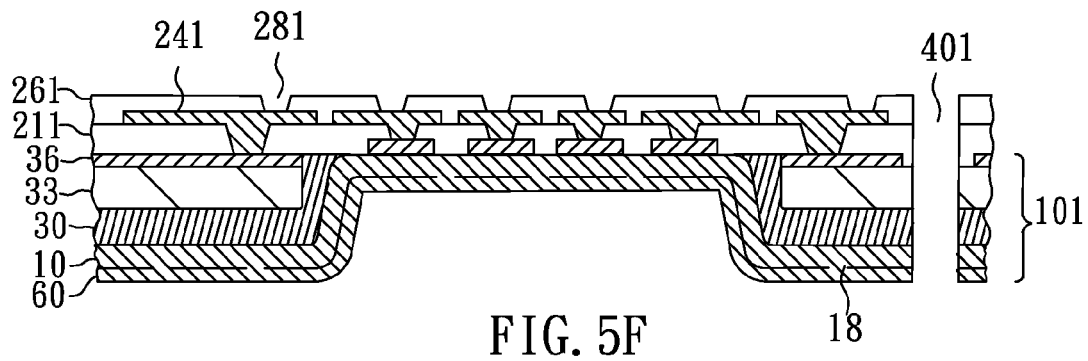
Figure 5G:
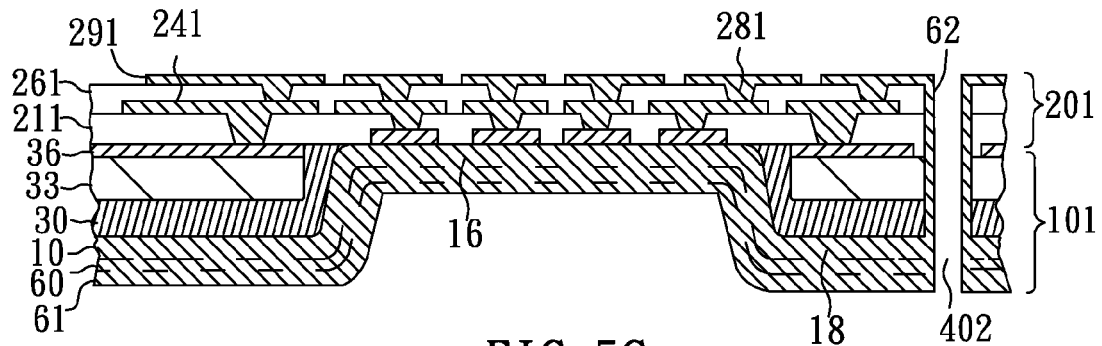
Figure 5H:
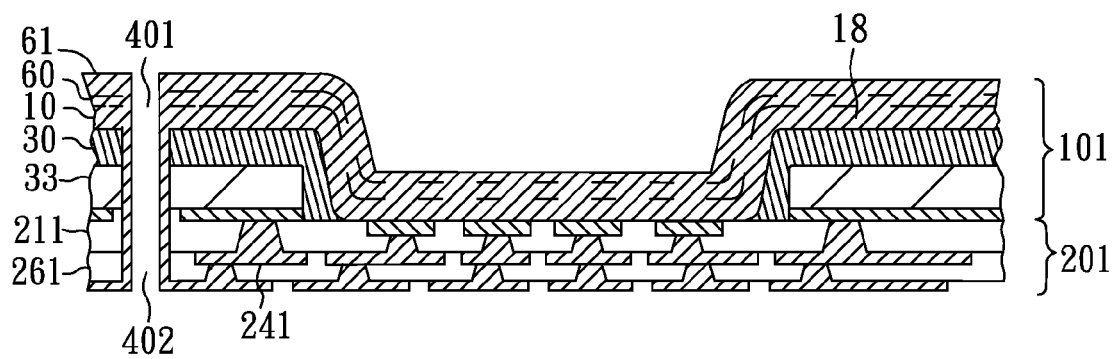
Figure 5I:
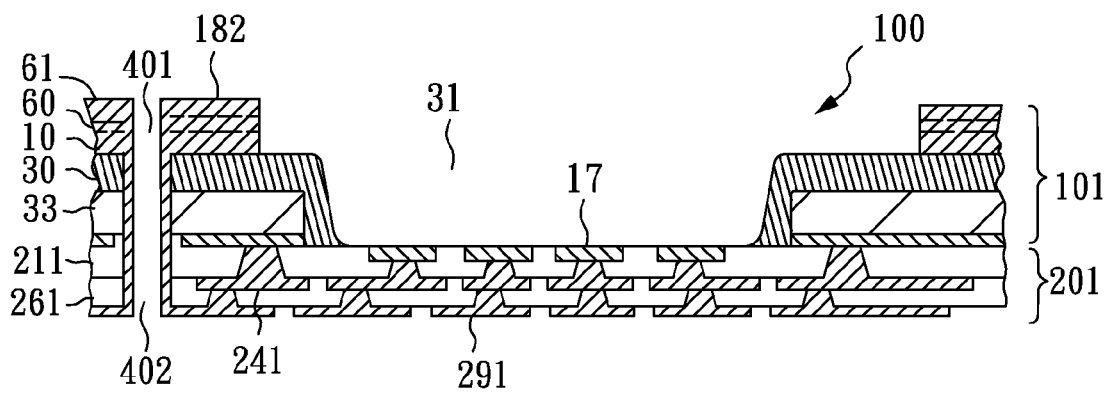

As shown in FIG. 5I, cavity substrate 100 includes supporting board 101, coreless build-up circuitry 201 and plated through-hole 402. Supporting hoard 101 includes adhesive 30, stiffener 33, electrical pads 17 and terminal 182. Electrical pads 17 are exposed from cavity 31 which is laterally covered and surrounded by adhesive 30. Coreless build-up circuitry 201 includes first dielectric layer 211, first conductive traces 241, second dielectric layer 261 and second conductive traces 291.

FIG. 5A is a cross-sectional view of the structure with first dielectric layer 211, such as epoxy resin, glass-epoxy, polyimide and the like, disposed on bump 16, electrical pads 17, adhesive 30 and stiffener 33. First dielectric layer 211 may be deposited by numerous techniques including film lamination, roll coating, spin coating and spray-on deposition. First dielectric layer 211 may be treated by plasma etching or coated with an adhesion promoter (not shown) to promote adhesion. First dielectric layer 211 has a thickness of 50 microns.

FIG. 5B is a cross-sectional view of the structure showing first via openings 221 formed through first dielectric layer 211 to expose electrical pads 17 and selected portions of conductive layer 36. First via openings 221 may be formed by numerous techniques including laser drilling, plasma etching and photolithography. Laser drilling can be enhanced by a pulsed laser. Alternatively, a scanning laser beam with a metal mask can be used. First via openings 221 have a diameter of 50 microns.

Referring now to FIG. 5C, first conductive traces 241 are formed on first dielectric layer 211. First conductive traces 241 extend from first dielectric layer 211 in the upward direction, extend laterally on first dielectric layer 211 and extend into first via openings 221 in the downward direction to make electrical contact with electrical pads 17 and conductive layer 36. First conductive traces 241 can be deposited by numerous techniques including electroplating, electroless plating, evaporating, sputtering, and their combinations as a single layer or multiple layers.

For instance, first conductive traces 241 are deposited as a first conductive layer by first dipping the structure in an activator solution to render first dielectric layer 211 catalytic to electroless copper, then a thin copper layer is electrolessly plated to serve as the seeding layer before a second copper layer is electroplated on the seeding layer to a desirable thickness. Alternatively, the seeding layer can be formed by sputtering a thin film such as titanium/copper onto first dielectric layer 211 as well as into first via openings 221 before depositing the electroplated copper layer on the seeding layer. Once the desired thickness is achieved, the first conductive layer (i.e. the combination of the electroplated copper layer and the seeding layer) is patterned to form first conductive traces 241. First conductive traces 241 can be patterned by numerous techniques including wet etching, electro-chemical etching, laser-assist etching, and their combinations with an etch mask (not shown) thereon that defines first conductive traces 241.

Also shown in FIG. 5C is first plated layer 60 deposited on bump 16 and flange 18 in the downward direction. First plated layer 60 can be deposited by the same activator solution, electroless copper seeding layer and electroplated copper layer as first conductive traces 241. Preferably, first plated layer 60 and first conductive traces 241 are the same material deposited simultaneously in the same manner and have the same thickness. First plated layer 60 is an unpatterned copper layer that contacts bump 16 and flange 18 at the lateral bottom surface and covers them in the downward direction. Bump 16, flange 18 and first plated layer 60 are shown as a single layer for convenience of illustration. The boundary (shown in phantom) between bump 16 and first plated layer 60 and between flange 18 and first plated layer 60 may be difficult or impossible to detect since copper is plated on copper. First conductive traces 241 can provide horizontal signal routing in both the X and Y directions and vertical (top to bottom) routing through first via openings 221 and serve as electrical connections for electrical pads 17 and conductive layer 36.

FIG. 5D is a cross-sectional view of the structure showing second dielectric layer 261 disposed on first conductive traces 241 and first dielectric layer 11. Like first dielectric layer 211, second dielectric layer 261 can be epoxy resin, glass-epoxy, polyimide and the like deposited by numerous techniques including film lamination, spin coating, roll coating, and spray-on deposition and has a thickness of 50 microns. Preferably, first dielectric layer 211 and second dielectric layer 261 are the same material with the same thickness formed in the same manner.

FIG. 5E is a cross-sectional view of the structure through-hole 401. Through-holes 401 corresponds to and is axially aligned with and concentrically positioned within opening 361 in conductive layer 36 and extends through second dielectric layer 261, first dielectric layer 211, stiffener 33, adhesive 30, flange 18 and first plated layer 60 in the vertical direction. Through-hole 401 is formed by mechanical drilling and can be formed by other techniques such as laser drilling and plasma etching with or without wet etching.

FIG. 5F is a cross-sectional view of the structure showing second via openings 281 formed through second dielectric layer 261 to expose selected portions of first conductive traces 241. Like first via openings 221, second via openings 281 can be formed by numerous techniques including laser drilling, plasma etching and photolithography and have a diameter of 50 microns. Preferably, first via openings 221 and second via openings 281 are formed in the same manner and have the same size.

Referring now to FIG. 5G, second conductive traces 291 are formed on second dielectric layer 261. Second conductive traces 291 extend from second dielectric layer 261 in the upward direction, extend laterally on second dielectric layer 261 and extend into second via openings 281 in the downward direction to make electrical contact with first conductive traces 241.

Second conductive traces 291 can be deposited as a second conductive layer by numerous techniques including electrolytic plating, electroless plating, sputtering, and their combinations and then patterned by numerous techniques including wet etching, electro-chemical etching, laser-assist etching, and their combinations with an etch mask (not shown) thereon that defines second conductive traces 291. Preferably, first conductive traces 241 and second conductive traces 291 are the same material with the same thickness formed in the same manner.

Also shown in HG 5G are second plated layer 61 outside through-hole 401 and connecting layer 62 in through-hole 401. Second plated layer 61 covers and extends from bump 16 and flange 18 in the downward direction, and connecting layer 62 is deposited in through-hole 401 and provides plated through-hole 402. Second plated layer 61 and connecting layer 62 can be deposited by the same activator solution, electroless copper seeding layer and electroplated copper layer as second conductive traces 291. Preferably, second plated layer 61, connecting layer 62 and second conductive traces 291 are the same material deposited simultaneously in the same manner and have the same thickness.

Second plated layer 61 is an unpatterned copper layer that contacts first plated layer 60 at the lateral bottom surface and covers it in the downward direction. Connecting layer 62 is a hollow tube that covers the sidewall of through-hole 401 in lateral directions and extends vertically to electrically connect flange 18 and first and second plated layers 60, 61 thereon to second conductive traces 291. Alternatively, connecting layer 62 can fill through-hole 401 in which case plated through-hole 402 is a metal post.

Bump 16, flange 18, first plated layer 60, second plated layer 61 and connecting layer 62 are shown as a single layer for convenience of illustration. The boundary (shown in phantom) between the metal layers may be difficult or impossible to detect since copper is plated on copper. However, the boundaries between the metal layers and adhesive 30, substrate 34, first dielectric layer 211 and second dielectric layer 261 are clear.

At this stage, as shown in FIG. 5G, coreless build-up circuitry 201 is accomplished, which includes first dielectric layer 211, first conductive traces 241, second dielectric layer 261 and second conductive traces 291. Furthermore, plated through-hole 402 is essentially shared by supporting board 101 and coreless build-up circuitry 201.

FIG. 5H is a cross-sectional view of the structure after it is inverted from FIG. 5G.

FIG. 5I is a cross-sectional view of cavity substrate 100 with electrical pads 17 exposed from cavity 31. Cavity 31 is defined in adhesive 30 by removing bump 16 as well as first and second plated layers 60, 61 thereon, thereby exposing electrical pads 17 from cavity 31. Simultaneously, selected portions of flange 18 as well as first and second plated layers 60, 61 thereon are removed to define terminal 182. Bump 16 and selected portions of flange 18 as well as first and second plated layers 60, 61 thereon can be removed by numerous techniques including wet chemical etching using acidic solution (e.g., Ferric Chloride, Copper Sulfate solutions), or alkaline solution Ammonia solution), electro-chemical etching, or mechanical process such as a drill or end mill followed by chemical etching. Cavity 31 is centrally located within opening 32 and aperture 40, and has a closed end in the downward direction and an open end in the upward direction. At the closed end, cavity 31 is coplanar with adhesive 30 and stiffener 33 while electrical pads 17 are coplanar with first dielectric layer 211. Additionally, cavity 31 has a cut-off pyramidal shape in which its dimension increases as it extends upwardly.

At this stage, as shown in FIG. 5I, supporting board 101 includes adhesive 30, stiffener 33, electrical pads 17 and terminal 182, and can provide mechanical support for coreless build-up circuitry 201 even removing sacrificial carrier 10. In this illustration, cavity substrate 100 includes adhesive 30, stiffener 33, electrical pads 17, terminal 182, coreless build-up circuitry 201 and plated through-hole. However, in some embodiments, terminal 182 and plated through-hole 402 may be omitted according to desired design. Furthermore, supporting board 101 may include multiple cavities 31 by applying sacrificial carrier 10 with multiple bumps 16 and thus defining multiple cavities 31 in adhesive 30.

Electrical pads 17 extend from the closed end of cavity 31 in the downward direction and are exposed from cavity 31 in the upward direction. Electrical pads 17 can serve as electrical contacts for a semiconductor device embedded in cavity 31 and provide an electrical connection between the semiconductor device and coreless build-up circuitry 201.

Adhesive 30 is solidified, laterally covers and surrounds and conformally coats a sidewall of cavity 31, extends laterally from cavity 31 to peripheral edges of cavity substrate 100, is sandwiched between terminal 182 and stiffener 33 outside gap 42, covers and contacts stiffener 33 in the upward direction, covers and contacts terminal 182 in the downward direction, and contacts connecting layer 62 in the lateral direction. Adhesive 30 has a first thickness where it is adjacent to the sidewall of cavity 31 and a second thickness where it covers stiffener 33 in the upward direction that is different from the first thickness. The mechanical rigidity of cured adhesive 30 and stiffener 33 can provide mechanical support for careless build-up circuitry 201.

Terminal 182 extends from adhesive 30 in the upward direction, is spaced from coreless build-up circuitry 201 and is adjacent to and integral with plated through-hole 402. Terminal 182 has a combined thickness of flange 18, first plated layer 60 and second plated layer 61, and can be used for grounding or/and supporting a heat sink attached on an embedded semiconductor device in cavity 31 or serve as an electrical contact for another semiconductor device or assembly.

Plated through-hole 402 is spaced from conductive layer 36 and first conductive traces 241 and extends vertically from terminal 182 to second conductive traces 291 through second dielectric layer 261, first dielectric layer 211, substrate 34 and adhesive 30 in an electrically conductive path between terminal 182 and second conductive traces 291. Thus, plated through-hole 402 extends from terminal 182 to the outer conductive layer of coreless build-up circuitry 201 and is spaced from the inner conductive layer of coreless build-up circuitry 201.

Coreless build-up circuitry 201 may include additional interconnect layers (i.e. a third dielectric layer with third via openings, third conductive traces and so on), if desired.

Cavity substrate 100 can accommodate multiple semiconductor devices rather than one with a single cavity or multiple cavities. Thus, multiple semiconductor devices can be mounted into a single cavity or separate semiconductor devices can be mounted into separate cavities. Accordingly, additional electrical pads 17 may be provided and coreless build-up circuitry 201 may includes additional conductive traces for additional devices.

Figure 5J:
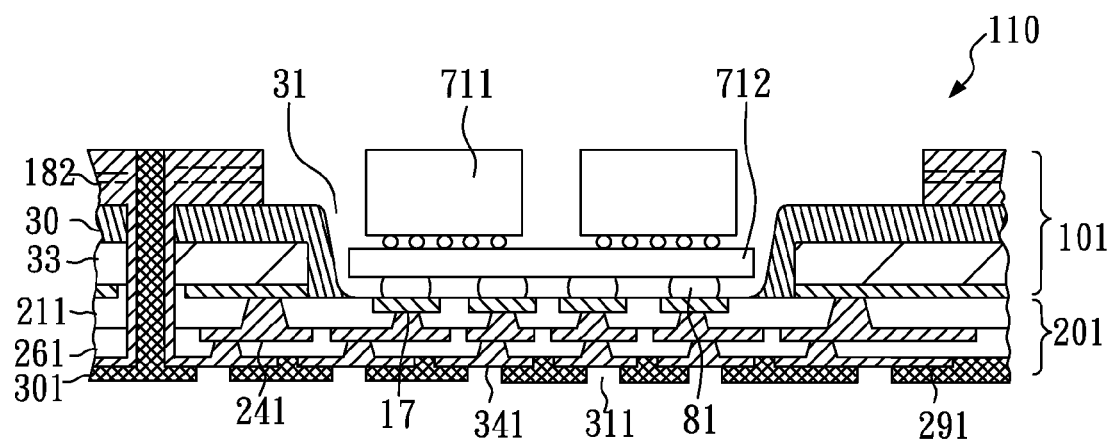
FIG. 5J is a cross-sectional view showing a semiconductor assembly with a semiconductor device packaged in a cavity substrate.

FIG. 5J is a cross-sectional view showing assembly 110 in which multiple chips 711 are attached on interposer 712 which is electrically coupled to electrical pads 17 located in cavity 31. Interconnect pads 341 exposed from opening 311 of solder mask material 301 can accommodate a conductive joint, such as solder bump, solder ball, pin, and the like, for electrical communication and mechanical attachment with external components or a PCB. The solder mask openings 311 may be formed by numerous techniques including photolithography, laser drilling and plasma etching.

Figure 5K:
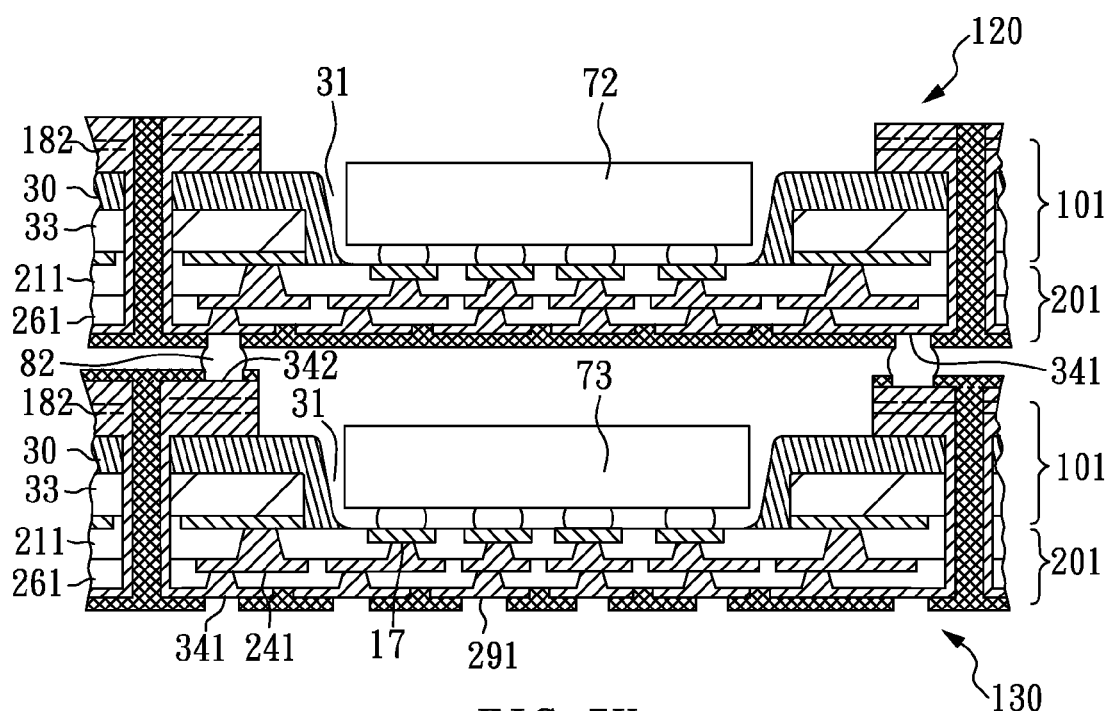
FIG. 5K is a cross-sectional view showing a three dimensional stacking structure that includes stackable semiconductor assemblies vertically stacked in a face-to-back manner in accordance with an embodiment of the present invention.

FIG. 5K is a cross-sectional view showing a three dimensional stacking structure. Top and bottom assemblies 120, 130 each respectively with semiconductor device 72, 73 in cavity 31 are stacked via solder balls 82 between bottom interconnect pads 341 of top assembly 120 and top interconnect pads 342 of bottom assembly 130. In this illustration, two assemblies are stacked. However, more assemblies may be stacked if desired.

Embodiment 2

FIGS. 6A-6I are cross-sectional views showing a method of making a cavity substrate with the plated through-hole connected to an inner conductive layer of the coreless build-up circuitry according to another aspect of the present invention.

For purposes of brevity, any description in Embodiment 1 is incorporated herein insofar as the same is applicable, and the same description need not be repeated.

Figure 6A:
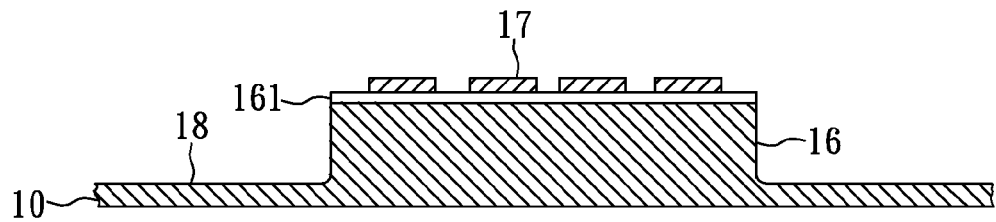
FIGS. 6A-6I are cross-sectional views showing a method of making a cavity substrate with a plated through-hole connected to an inner conductive layer of the coreless build-up circuitry in accordance with another embodiment of the present invention.

FIG. 6A is a cross-sectional view of sacrificial carrier 10 with barrier layer 161 at bump 16 and electrical pads 17 on barrier layer 161. Sacrificial carrier 10 used in this embodiment is the same as that illustrated in Embodiment 1, except that no stamped cavity is defined in bump 16 and bump 16 has a rectangular cylinder shape with a constant diameter according to this embodiment. Besides, sacrificial carrier 10 according to this embodiment further includes barrier layer 161 on bump 16. Barrier layer 161 extends from and covers bump 16 in the upward direction. Barrier layer 161 can be deposited by numerous techniques including electroplating, electroless plating, evaporating, sputtering and their combinations. Barrier layer 161 is illustrated as a tin layer but also can be made of other various barrier materials that can protect electrical pads 17 from etching during removal of bump 16. Electrical pads 17 are deposited on barrier layer 161 and are spaced from and extend beyond bump 16 in the upward direction. Electrical pads 17 are illustrated as copper pads but other various materials that remain stable under removing barrier layer 161 are also doable.

Figure 6B:
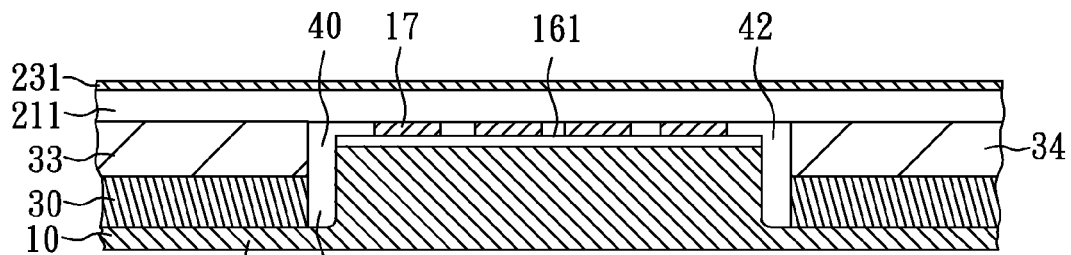

FIG. 6B is a cross-sectional view of the structure with adhesive 30 on flange 18, stiffener 33 on adhesive 30, first dielectric layer 211 on stiffener 33 and electrical pads 17, and metal layer 231 on first dielectric layer 211. Bump 16 is inserted into opening 32 and aperture 40 without contacting adhesive 30 and stiffener 33 and is aligned with and centrally located within opening 32 and aperture 40. As a result, gap 42 is located in aperture 40 between bump 16 and stiffener 33. In addition, opening 32 and aperture 40 are precisely aligned with one another and have the same dimension, and first dielectric layer 211 and metal layer 231 cover stiffener 33, bump 16, barrier layer 161 and electrical pads 17 in the upward direction. In this illustration, substrate 34 without conductive layer thereon is applied as stiffener 33.

Figure 6C:
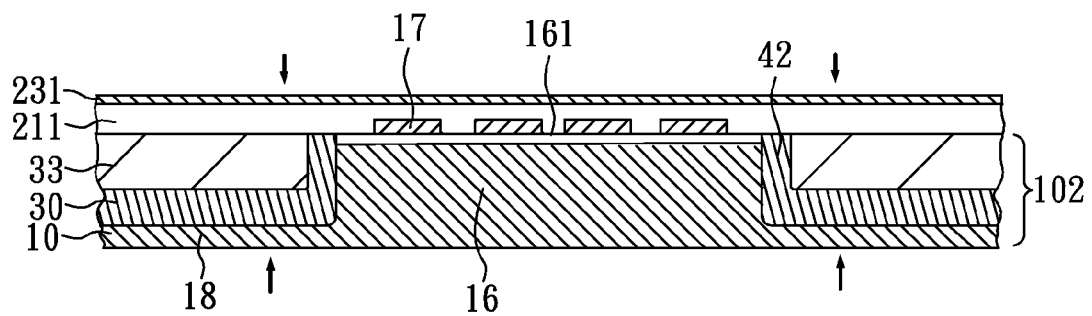

FIG. 6C is a cross-sectional view of the structure with adhesive 30 in gap 42 and first dielectric layer 211 laminated onto stiffener 33, barrier layer 161 and electrical pads 17. Adhesive 30 is flowed into gap 42 by applying heat and pressure. In detail, adhesive 30 is forced into gap 42 by applying downward pressure to metal layer 231 and/or upward pressure to sacrificial carrier 10, thereby moving stiffener 33 and sacrificial carrier 10 towards one another and applying pressure to adhesive 30 while simultaneously applying heat to adhesive 30. Adhesive 30 becomes compliant enough under the heat and pressure to conform to virtually any shape. Meanwhile, first dielectric layer 211 is forced and laminated onto stiffener 33, barrier layer 161 and electrical pads 17 under the heat and pressure and contacts adhesive 30. Although stiffener 33, adhesive 30 and barrier layer 161 are illustrated as coplanar with one another, they may be practically not coplanar with one another and first dielectric layer 211 may also be forced into gap 42.

The upward motion of sacrificial carrier 10 relative to metal layer 231 is shown by the thin upward arrows, and the downward motion of metal layer 231 relative to sacrificial carrier 10 is shown by the thin downward arrows.

After adhesive 30 fills up gap 42 and first dielectric layer 211 is laminated, adhesive 30 and first dielectric layer 211 are solidified. Accordingly, adhesive 30 and first dielectric layer 211 as solidified respectively provide secure robust mechanical bonds between sacrificial carrier 10 and stiffener 33, between metal layer 231 and electrical pads 17, and between metal layer 231 and stiffener 33.

At this stage, as shown in FIG. 6C, supporting board 102 is accomplished, which includes sacrificial carrier 10 with barrier layer 161 at bump 16, adhesive 30, stiffener 33 and electrical pads 17.

Figure 6D:
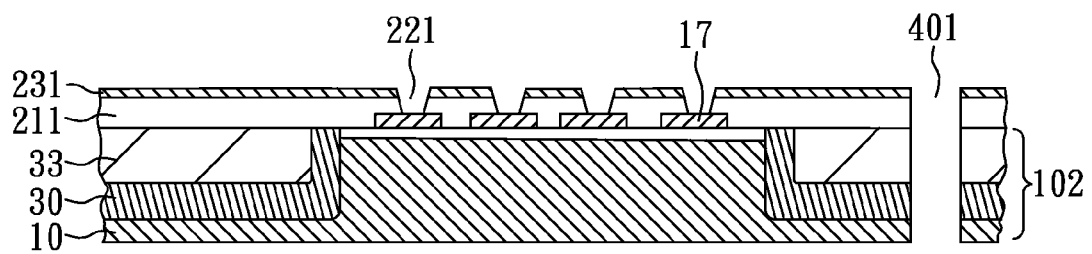

FIG. 6D is a cross-sectional view of the structure showing first via openings 221 formed through first dielectric layer 211 and metal layer 231 and through-hole 401 formed through metal layer 231, first dielectric layer 211, stiffener 33, adhesive 30 and flange 18. First via openings 221 are aligned with and expose electrical pads 17, and through-hole 401 extends through the structure in vertical directions.

Figure 6E:
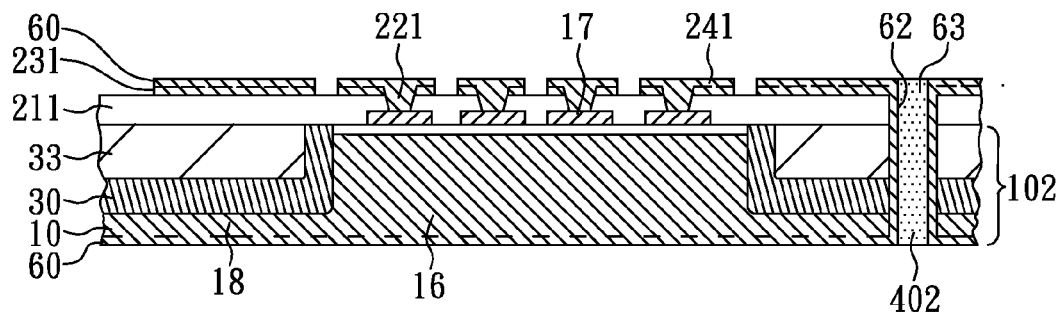

FIG. 6E is a cross-sectional view of the structure showing first conductive traces 241 formed on first dielectric layer 211 by depositing and patterning metal. First conductive traces 241 are formed by depositing first plated layer 60 on metal layer 231 and into first via openings 221 and then patterning metal layer 231 and first plated layer 60 thereon. First plated layer 60 covers and extends from metal layer 231 in the upward direction and extends into first via openings 221 in the downward direction to make electrical contact with electrical pads 17. First plated layer 60 also covers the lateral bottom surface in the downward direction.

Metal layer 231 and first plated layer 60 thereon are shown as a single layer for convenience of illustration. The boundary (shown in phantom) between the metal layers may be difficult or impossible to detect since copper is plated on copper. However, the boundary between first plated layer 60 and first dielectric layer 211 is clear.

Also shown in FIG. 6E is connecting layer 62 and insulative filler 63 in through-hole 401. Connecting layer 62 provides plated through-hole 402 in through-hole 401. Connecting layer 62 is a hollow tube that covers the inner sidewall of through-hole 401 in lateral directions and extends vertically to electrically connect flange 18 and first plated layer 60 thereon to first conductive traces 241, and insulative filler 63 fills the remaining space in through-hole 401. Alternatively, connecting layer 62 can fill through-hole 401 in which case connecting layer 62 is a metal post and there is no space for insulative filler 63 in through-hole 401.

Preferably, first plated layer 60 and connecting layer 62 are the same material deposited simultaneously in the same manner and have the same thickness.

Bump 16, flange 18, first plated layer 60 and connecting layer 62 are shown as a single layer for convenience of illustration. The boundary (shown in phantom) between the metal layers may be difficult or impossible to detect since copper is plated on copper. However, the boundary between metal layers and adhesive 30, stiffener 33 and first dielectric layer 211 are clear.

Figure 6F:
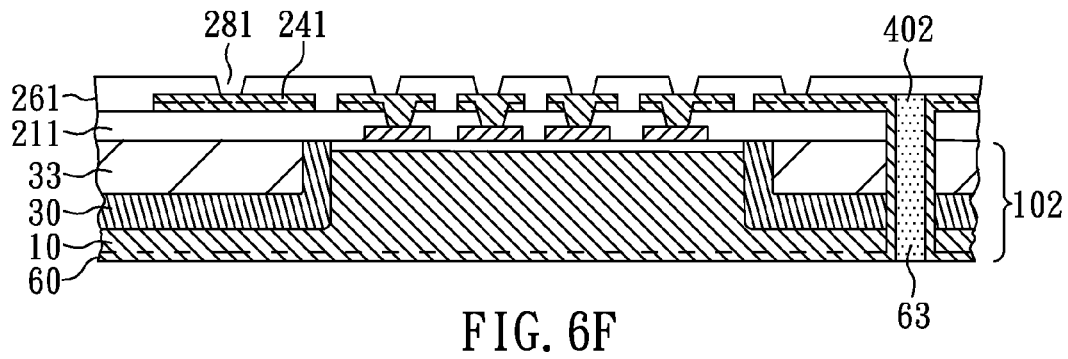

FIG. 6F is a cross-sectional view of the structure showing second dielectric layer 261 with second via openings 281. Second dielectric layer 261 is disposed on first conductive traces 241 and first dielectric layer 211, and second via openings 281 extend through second dielectric layer 261 and expose selected portions of first conductive traces 241.

Figure 6G:
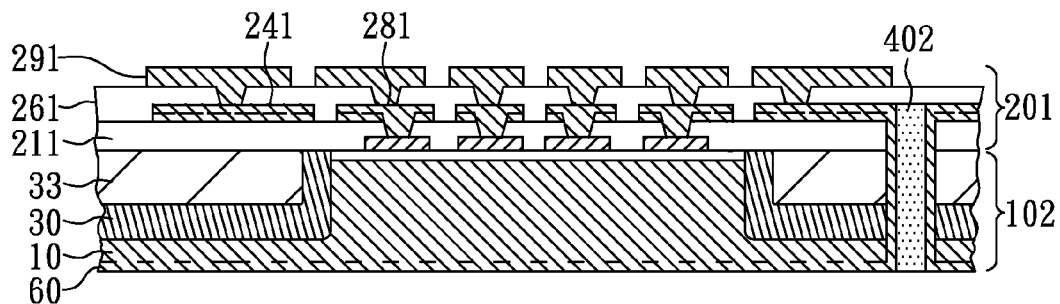

FIG. 6G is the cross-sectional view of the structure showing second conductive traces 291 formed on second dielectric layer 261. Second conductive traces 291 extend from second dielectric layer 261 in the upward direction, extend laterally on second dielectric layer 261 and extend into second via openings 281 to make electrical contact with the conductive traces 241.

At this stage, as shown in FIG. 6G, coreless build-up circuitry 201 is accomplished, which includes first dielectric layer 211, first conductive traces 241, second dielectric layer 261 and second conductive traces 291. Plated through-hole 402 is connected to an inner conductive layer of the coreless build-up circuitry 201.

Figure 6H:
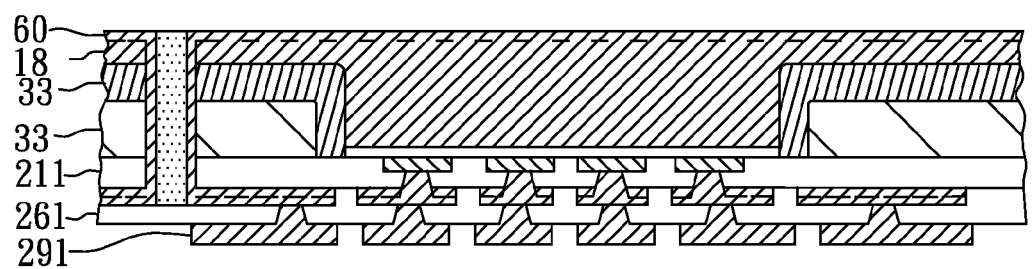

FIG. 6H is a cross-sectional view of the structure after it is inverted from FIG. 6G.

Figure 6I:
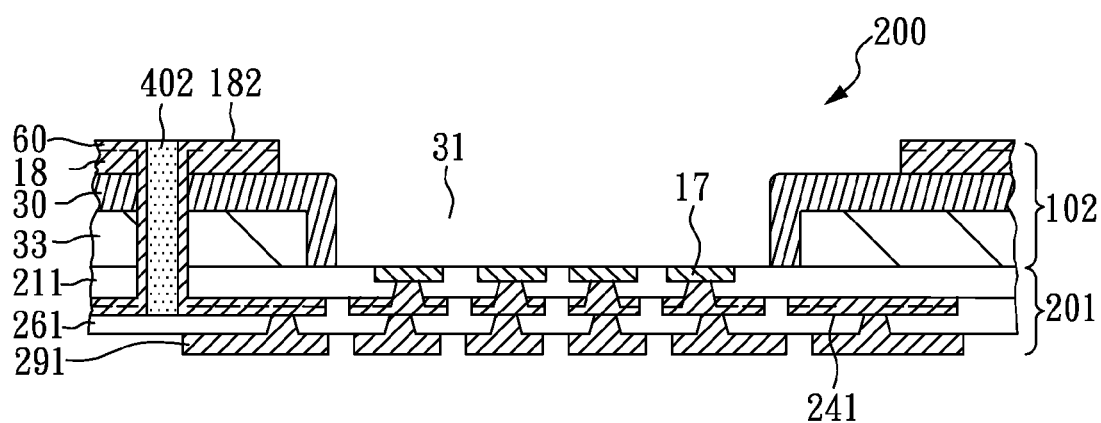

FIG. 6I is a cross-sectional view of cavity substrate 200 with electrical pads 17 exposed from cavity 31. Bump 16 and a selected portion of flange 18 as well as first plated layer 60 thereon are removed to expose barrier layer 161 and define terminal 182. Then, barrier layer 161 is removed to expose electrical pads 17 from cavity 31. Terminal 182 has a combined thickness of flange 18 and first plated layer 60.

At this stage, as shown in FIG. 6I, supporting board 102 includes adhesive 30, stiffener 33, electrical pads 17 and terminal 182. Terminal 182 extends from adhesive 30 in the upward direction and is spaced from coreless build-up circuitry 201 by adhesive 30 and stiffener 33, and is adjacent to and is electrically connected to plated through-holes 402. Plated through-hole 402 is shared by supporting board 102 and coreless build-up circuitry 201 and extends from terminal 182 to first conductive traces 241 through adhesive 30, stiffener 33 and first dielectric layer 211 in an electrically conductive path between coreless build-up circuitry 201 and terminal 182.

Embodiment 3

FIGS. 7A-7J are cross-sectional views showing a method of making a cavity substrate with a plated through-hole connected to an inner pad of the supporting board according to yet another aspect of the present invention.

For purposes of brevity, any description in Embodiment 1 is incorporated herein insofar as the same is applicable, and the same description need not be repeated.

Figure 7A:
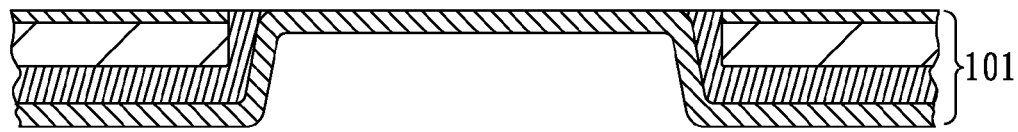
FIGS. 7A-7J are cross-sectional views showing a method of making a cavity substrate with a plated through-hole connected to an inner pad of the supporting board in accordance with yet another embodiment of the present invention.

FIG. 7A is a cross-sectional view of supporting board 101, which is manufactured by the steps shown in FIGS. 1A-4E.

Figure 7B:
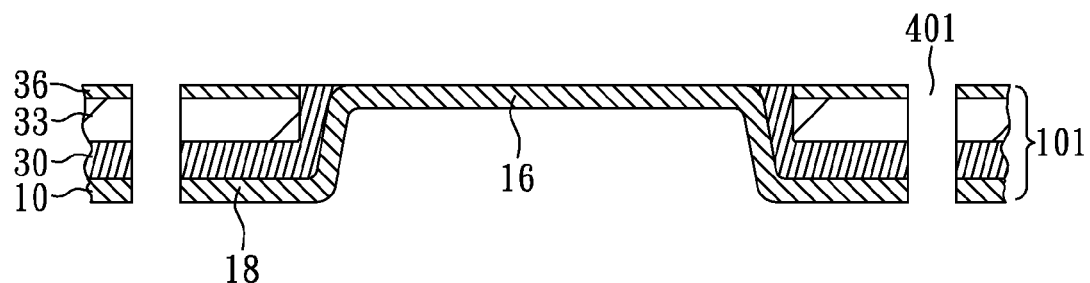

FIG. 7B is a cross-sectional view of the structure with through-holes 401. Through-holes 401 extend through flange 18, adhesive 30 and stiffener 33 in the vertical direction.

Figure 7C:
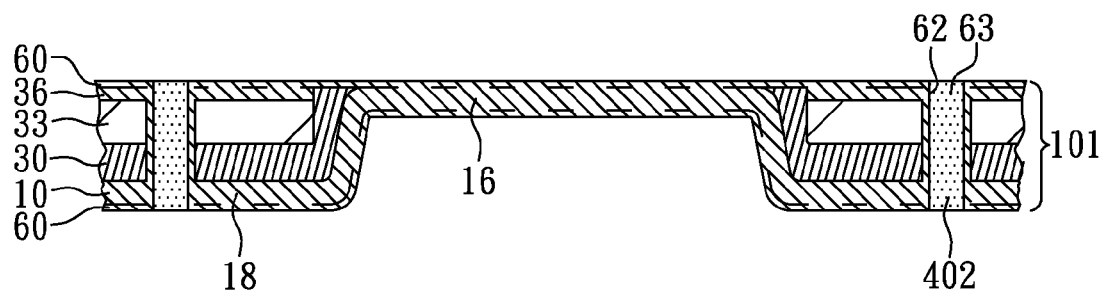

FIG. 7C is a cross-sectional view of the structure with first plated layer 60 outside through-holes 401 and connecting layer 62 and insulative filler 63 in through-holes 401. First plated layer 60 covers and extends from bump 16 and flange 18 in the downward direction. First plated layer 60 also covers and extends from hump 16, adhesive 30 and conductive layer 36 in the upward direction.

Also shown in FIG. 7C is connecting layer 62 deposited in the through-holes 401 to provide plated through-holes 402. Connecting layer 62 is a hollow tube that covers the sidewall of through-hole 401 in lateral directions and extends vertically to electrically connect flange 18 and first plated layer 60 thereon to conductive layer 36 and first plated layer 60 thereon, and insulative filler 63 fills the remaining space in through-holes 401. Alternatively, connecting layer 62 can fill through-hole 401 in which case plated through-hole 402 is a metal post and there is no space for an insulative filler in through-hole 401.

Preferably, first plated layer 60 and connecting layer 62 are the same material deposited simultaneously in the same manner and have the same thickness.

Bump 16, flange 18, first plated layer 60, conductive layer 36 and connecting layer 62 are shown as a single layer for convenience of illustration. The boundary (shown in phantom) between the metal layers may be difficult or impossible to detect since copper is plated on copper. However, the boundary between adhesive 30 and first plated layer 60, between adhesive 30 and connecting layer 62, and between substrate 34 and connecting layer 62 is clear.

Figure 7D:
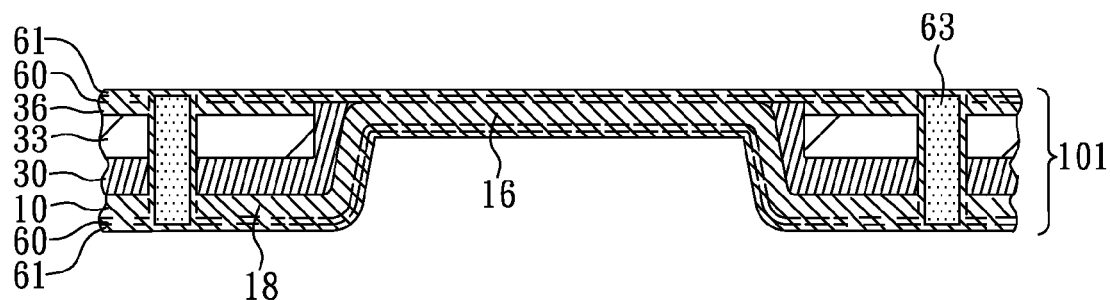

FIG. 7D is a cross-sectional view of the structure with second plated layer 61 deposited on first plated layer 60 and insulative filler 63. Second plated layer 61 is an unpatterned copper layer that covers and extends from first plated layer 60 and insulative filler 63 in the upward and downward directions.

For convenience of illustration, hump 16, flange 18, first plated layer 60, second plated layer 61, conductive layer 36 and connecting layer 62 are shown as a single layer due to that the boundary (shown in phantom) between the metal layers may be difficult or impossible to detect since copper is plated on copper.

Figure 7E:
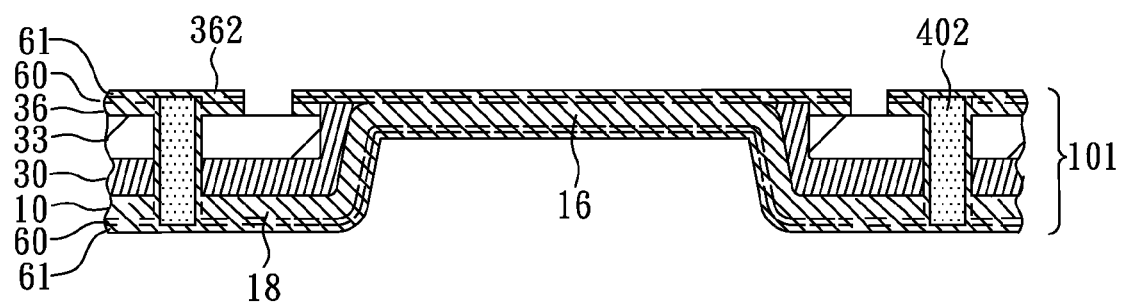

FIG. 7E is a cross-sectional view of the structure showing inner pads 362 formed on plated through-holes 402 by selective patterning of conductive layer 36, first metal layer 60 and second metal layer 61 on the upper surface via photolithography and wet etching. Inner pads 362 are adjacent to and electrically connected to plated through-hole 402, extend laterally from plated through-holes 402 and cover plated through-holes 402 in the upward direction.

Figure 7F:
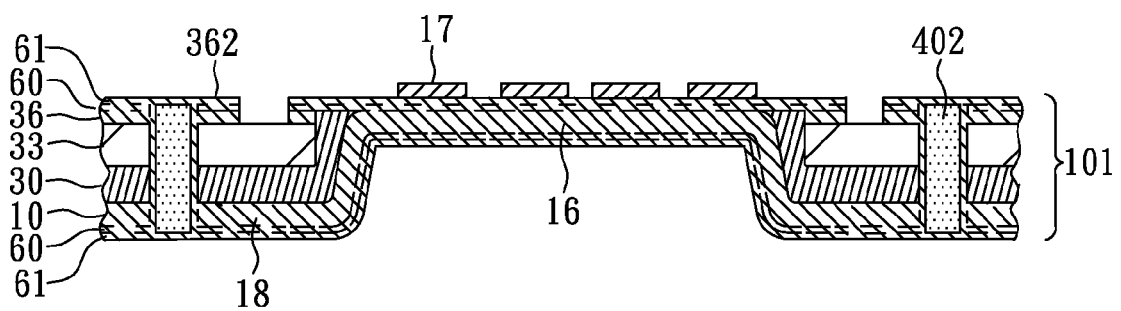

FIG. 7F is a cross-sectional view of supporting board 101 with electrical pads 17 at bump 16. Electrical pads 17 extend from second plated layer 61 and beyond bump 16 in the upward direction.

At this stage, as shown in FIG. 7F, supporting board 101 includes sacrificial carrier 10, first plated layer 60, second plated layer 61, adhesive 30, stiffener 33, inner pads 362 and electrical pads 17. Plated through-holes 402 extend through supporting board 101 in vertical directions to provide an electrical connection between inner pad 362 and flange 18 as well as first and second plated layer 60, 61 thereon.

Figure 7G:
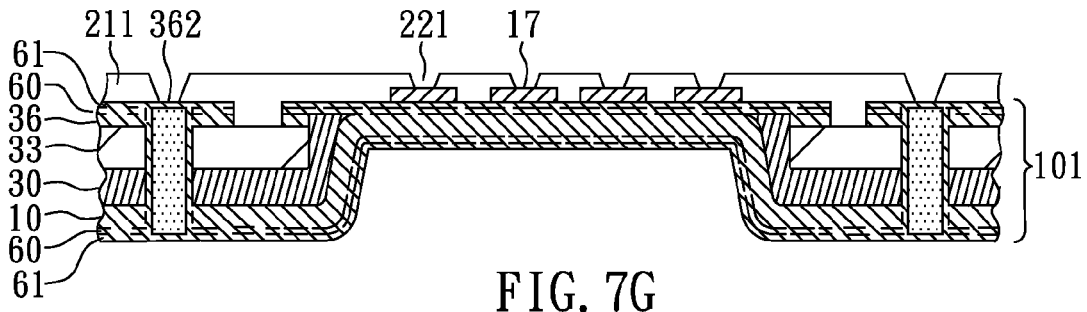

FIG. 7G is a cross-sectional view of the structure with first dielectric layer 211 disposed on second plated layer 61 and electrical pads 17 in the upward direction. Also shown in FIG. 7G are first via openings 221 formed through first dielectric layer 211 to expose electrical pads 17 and inner pads 362.

Figure 7H:
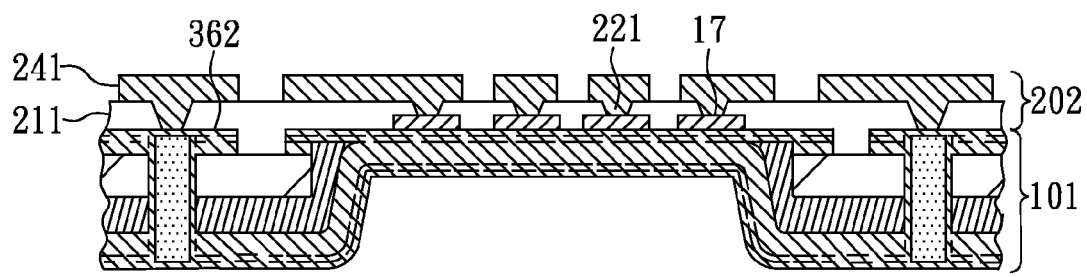

Referring now to FIG. 7H, first conductive traces 241 are formed on first dielectric layer 211. First conductive traces 241 extend from first dielectric layer 211 in the upward direction, extend laterally on first dielectric layer 211 and extend through first via openings 221 in the downward direction to make electrical contact with electrical pads 17 and inner pads 362.

At this stage, as shown in FIG. 7H, coreless build-up circuitry 202 is accomplished, which includes first dielectric layer 211 and first conductive traces 241.

Figure 7I:
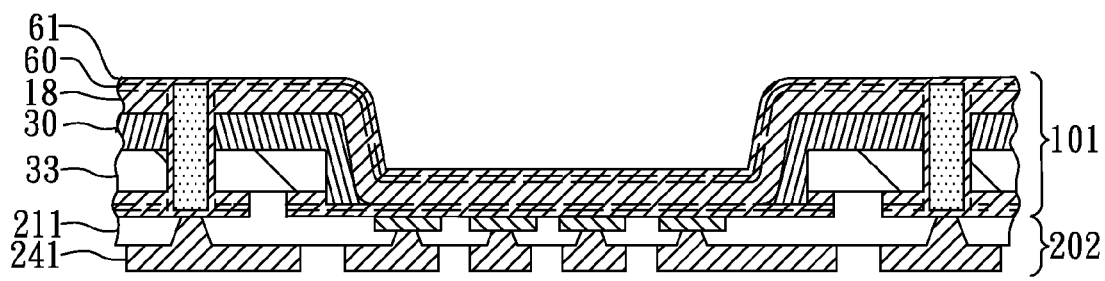

FIG. 7I is a cross-sectional view of the structure after it is inverted from FIG. 7H.

Figure 7J:
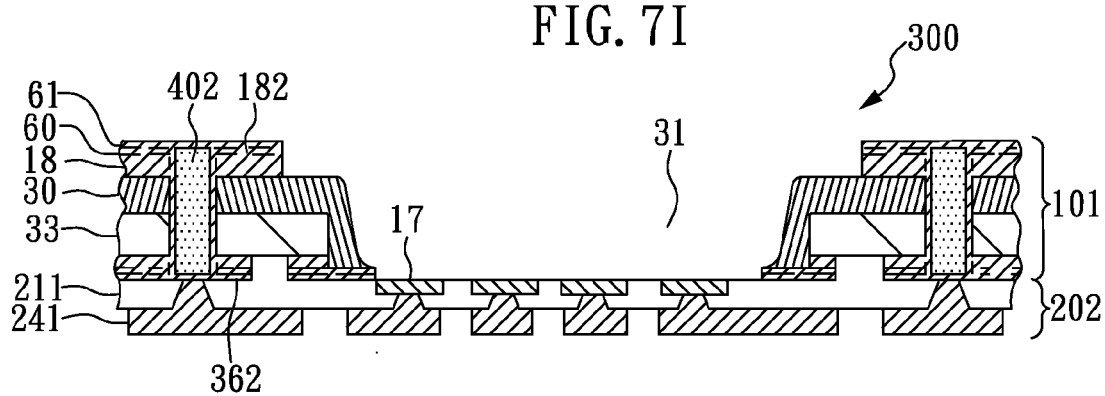

FIG. 7J is a cross-sectional view of cavity substrate 300 with electrical pads 17 exposed from cavity 31. Cavity 31 is defined in adhesive 30 by removing bump 16 and a selected portion of flange 18 as well as first and second plated layers 60, 61 thereon, thereby exposing electrical pads 17 from cavity 31 and defining terminals 182. Terminal 182 has a combined thickness of flange 18, first plated layer 60 and second plated layer 61.

At this stage, as shown in FIG. 7J, supporting board 101 includes adhesive 30, stiffener 33, electrical pads 17, inner pads 362 and terminal 182. Terminals 182 extend from adhesive 30 in the upward direction and are adjacent to and electrically connected to plated through-holes 402. Inner pads 362 extend from stiffener 33 in the downward direction and are adjacent to and electrically connected to plated through-holes 402 and first conductive traces 241. Plated through-holes 402 extend from terminals 182 to inner pads 362 through adhesive 30 and stiffener 33 in an electrically conductive path between coreless build-up circuitry 202 and terminals 182.

The cavity substrates, stackable semiconductor assemblies and 3D stacking structures described above are merely exemplary. Numerous other embodiments are contemplated. In addition, the embodiments described above can be mixed-and-matched with one another and with other embodiments depending on design and reliability considerations. For instance, the stiffener can include ceramic material or epoxy-based laminate, and can have embedded single-level conductive traces or multi-level conductive traces. The supporting board can include multiple bumps to define multiple cavities in the adhesive. Accordingly, the cavity substrate can include multiple cavities arranged in an array for multiple semiconductor devices and additional electrical pads can be provided to accommodate additional semiconductor devices. Also, the build-up circuitry can include additional conductive traces to receive and route additional electrical pads.

The semiconductor device can share or not share the cavity with other semiconductor devices. For instance, a single semiconductor device can be mounted into the built-in cavity. Alternatively, numerous semiconductor devices can be mounted into the built-in cavity. For instance, four small chips in a 2×2 array can be placed in the built-in cavity and additional electrical pads and conductive traces can be provided for additional chips. This may be more cost effective than providing a miniature cavity for each chip.

The semiconductor device can be a packaged or unpackaged chip. Furthermore, the semiconductor device can be a bare chip, LGA, or QFN, etc. The semiconductor device can be mechanically and electrically connected to the cavity substrate using a wide variety of connection media including solder. The built-in cavity can be customized for the semiconductor device embedded therein. For instance, the cavity can have a square or rectangular shape at its bottom with the same or similar topography as the semiconductor device.

The supporting board can provide a robust mechanical support for the coreless build-up circuitry, and the coreless build-up circuitry provides shorten signal routing so that signal loss and distortion can be reduced under accelerated operation of the semiconductor device.

The term "adjacent" refers to elements that are integral (single-piece) or in contact (not spaced or separated from) with one another. For instance, the bump is adjacent to the flange but not the stiffener.

The term "overlap" refers to above and extending within a periphery of an underlying element. Overlap includes extending inside and outside the periphery or residing within the periphery. For instance, in the cavity-up position, the flange overlaps the stiffener since an imaginary vertical line intersects the flange and the stiffener, regardless of whether another element such as the adhesive is between the flange and the stiffener and is intersected by the line, and regardless of whether another imaginary vertical line intersects the flange but not the stiffener (within the aperture of the stiffener). Likewise, the adhesive overlaps the stiffener, the flange overlaps the adhesive and the adhesive is overlapped by the stiffener. Moreover, overlap is synonymous with over and overlapped by is synonymous with under or beneath.

The term "contact" refers to direct contact. For instance, the stiffener contacts the adhesive but does not contact the bump.

The term "cover" refers to incomplete and complete coverage in a vertical and/or lateral direction. For instance, in the cavity-up position, the adhesive covers the stiffener but does not cover the electrical pads in the upward direction.

The term "layer" refers to patterned and un-patterned layers. For instance, the conductive layer can be an un-patterned blanket sheet on the substrate when the stiffener including the conductive layer and the substrate is mounted on the adhesive. Furthermore, a layer can include stacked layers.

The terms "opening" and "aperture" and "hole" refer to a through hole and are synonymous. For instance, in the cavity-down position, the bump is exposed by the adhesive in the upward direction when it is inserted into the opening in the adhesive. Likewise, the hump is exposed by the stiffener in the upward direction when it is inserted into the aperture in the stiffener.

The term "inserted" refers to relative motion between elements. For instance, the bump is inserted into the aperture regardless of whether the flange is stationary and the stiffener moves towards the flange, the stiffener is stationary and the flange moves towards the stiffener or the flange and the stiffener both approach the other. Furthermore, the bump is inserted (or extends) into the aperture regardless of whether it goes through (enters and exits) or does not go through (enters without exiting) the aperture.

The phrase "move towards one another" also refers to relative motion between elements. For instance, the flange and the stiffener move towards one another regardless of whether the flange is stationary and the stiffener moves towards the flange, the stiffener is stationary and the flange moves towards the stiffener or the flange and the stiffener both approach the other.

The phrase "aligned with" refers to relative position between elements. For instance, the bump is aligned with the aperture when the adhesive is mounted on the flange, the stiffener is mounted on the adhesive, the bump is inserted into and aligned with the opening and the aperture is aligned with the opening regardless of whether the bump is inserted into the aperture or is below and spaced from the aperture.

The phrase "mounted on" includes contact and non-contact with a single or multiple support element(s). For instance, the heat sink can be mounted on the semiconductor device regardless of whether it contacts the semiconductor device or is separated from the semiconductor device by an adhesive.

The phrase "adhesive . . . in the gap" refers to the adhesive in the gap. For instance, adhesive that extends across the stiffener in the gap refers to the adhesive in the gap that extends across the stiffener. Likewise, adhesive that contacts and is sandwiched between the bump and the stiffener in the gap refers to the adhesive in the gap that contacts and is sandwiched between the bump at the inner sidewall of the gap and the stiffener at the outer sidewall of the gap.

The phrase "electrical connection" or "electrically connects" or "electrically connected" refers to direct and indirect electrical connection. For instance, the first conductive trace provides an electrical connection between the interconnect pad and the electrical pad regardless of whether the first conductive trace is adjacent to the interconnect pad or electrically connected to the interconnect pad by the second conductive trace.

The term "above" refers to upward extension and includes adjacent and non-adjacent elements as well as overlapping and non-overlapping elements. For instance, in the cavity-down position, the bump extends above, is adjacent to and protrudes from the flange.

The term "below" refers to downward extension and includes adjacent and non-adjacent elements as well as overlapping and non-overlapping elements. For instance, in the cavity-up position, the bump extends below, is adjacent to and protrudes from flange in the downward direction. Likewise, the bump extends below the stiffener even though it is not adjacent to or overlapped by the stiffener.

The "first vertical direction" and "second vertical direction" do not depend on the orientation of the cavity substrate (or the supporting board), as will be readily apparent to those skilled in the art. For instance, the bump extends vertically beyond the stiffener in the second vertical direction and vertically beyond the flange in the first vertical direction regardless of whether the supporting board is inverted. Likewise, the flange extends "laterally" from the bump in a lateral plane regardless of whether the supporting board is inverted, rotated or slanted. Thus, the first and second vertical directions are opposite one another and orthogonal to the lateral directions, and laterally aligned elements are coplanar with one another at a lateral plane orthogonal to the first and second vertical directions. Furthermore, the first vertical direction is the downward direction and the second vertical direction is the upward direction in the cavity-up position, and the first vertical direction is the upward direction and the second vertical direction is the downward direction in the cavity-down position.

The cavity substrate and the semiconductor assembly using the same according to the present invention have numerous advantages. The cavity substrate and the semiconductor assembly are reliable, inexpensive and well-suited for high volume manufacture. A heat sink can be attached on the device mounted into the built-in cavity of the cavity substrate to facilitate heat dissipation. Therefore, the cavity substrate is especially well-suited for high power semiconductor devices and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional packaging techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

What is claimed is:

1. A method of making a cavity substrate, comprising:
   providing a supporting board that includes a sacrificial carrier, a stiffener, an adhesive and an electrical pad, wherein (i) the sacrificial carrier includes a bump and a flange, (ii) the bump is adjacent to and integral with the flange and extends from the flange in a first vertical direction, (iii) the flange extends laterally from the bump in lateral directions orthogonal to the first vertical direction, (iv) the stiffener is attached to the sacrificial carrier via the adhesive between the stiffener and the flange and between the stiffener and the bump, and (v) the electrical pad extends beyond the bump in the first vertical direction and is covered by the bump in a second vertical direction opposite the first vertical direction;
   forming a coreless build-up circuitry that covers the electrical pad, the bump and the stiffener in the first vertical direction and is electrically connected to the electrical pad; and
   removing the bump to form a cavity and expose the electrical pad and a portion of the coreless build-up circuitry from a closed end of the cavity, wherein the cavity is laterally covered and surrounded by the adhesive and faces in the second vertical direction.

2. The method of claim 1, wherein the sacrificial carrier further includes a stamped cavity in the bump, and the stamped cavity is covered by the bump in the first vertical direction.

3. The method of claim 1, wherein the providing the supporting board includes:
   providing the sacrificial carrier that includes the bump and the flange;
   attaching the stiffener to the sacrificial carrier via the adhesive between the stiffener and the flange and between the stiffener and the bump, including aligning the bump with an aperture of the stiffener; and
   providing the electrical pad at the bump of the sacrificial carrier before or after attaching the stiffener to the sacrificial carrier via the adhesive.

4. The method of claim 3, wherein the providing the sacrificial carrier includes mechanically stamping a metal plate.

5. The method of claim 3, wherein the attaching the stiffener to the sacrificial carrier via the adhesive includes:
   providing the adhesive that is non-solidified between the flange of the sacrificial carrier and the stiffener, including aligning the bump of the sacrificial carrier with an opening of the adhesive and the aperture of the stiffener; then flowing the adhesive into a gap located in the aperture between the bump and the stiffener; and then solidifying the adhesive, thereby mechanically attaching the stiffener to the bump and the flange.

6. The method of claim 1, wherein the forming the coreless build-up circuitry includes:

providing a dielectric layer that covers the electrical pad, the bump and the stiffener in the first vertical direction and includes a via opening that is aligned with the electrical pad; and then providing a conductive trace that extends from the dielectric layer in the first vertical direction and extends laterally on the dielectric layer and extends through the via opening in the second vertical direction to the electrical pad.

7. The method of claim 1, further comprising providing a plated through-hole that extends through the adhesive and the stiffener to provide an electrical connection between both sides of the cavity substrate.

8. The method of claim 7, wherein the providing the plated through-hole includes:

forming a through-hole that extends through the adhesive and the stiffener in the vertical directions; and then providing a connecting layer on an inner sidewall of the through-hole.

9. The method of claim 1, wherein the removing the bump includes chemical etching process.

10. The method of claim 7, wherein the removing the bump includes simultaneously removing a selected portion of the flange to define a terminal, and the plated through-hole provides an electrical connection between the terminal and the coreless build-up circuitry.

11. The method of claim 1, wherein the providing the supporting board and the forming the coreless build-up circuitry includes:

providing the sacrificial carrier with the electrical pad at the bump of the sacrificial carrier; then attaching the stiffener to the sacrificial carrier via the adhesive between the stiffener and the flange and between the stiffener and the bump, including aligning the bump with an aperture of the stiffener; then providing a dielectric layer that covers the electrical pad, the bump and the stiffener in the first vertical direction; then forming a via opening in the dielectric layer, wherein the via opening is aligned with the electrical pad; and then providing a conductive trace that extends from the dielectric layer in the first vertical direction and extends laterally on the dielectric layer and extends through the via opening in the second vertical direction to the electrical pad.

12. The method of claim 1, wherein the providing the supporting board and the forming the careless build-up circuitry includes:

providing the sacrificial carrier; then attaching the stiffener to the sacrificial carrier via the adhesive between the stiffener and the flange and between the stiffener and the bump, including aligning the bump with an aperture of the stiffener; then providing the electrical pad at the bump; then providing a dielectric layer that covers the electrical pad, the bump and the stiffener in the first vertical direction; then forming a via opening in the dielectric layer, wherein the via opening is aligned with the electrical pad; and then providing a conductive trace that extends from the dielectric layer in the first vertical direction and extends laterally on the dielectric layer and extends through the via opening in the second vertical direction.

13. The method of claim 1, wherein the providing the supporting board and the forming the careless build-up circuitry includes:

providing the sacrificial carrier with the electrical pad at the bump of the sacrificial carrier; then attaching the stiffener to the sacrificial carrier via the adhesive between the stiffener and the flange and between the stiffener and the bump and simultaneously laminating a dielectric layer onto the bump, the electrical pad and the stiffener, including aligning the bump with an aperture of the stiffener; then forming a via opening in the dielectric layer, wherein the via opening is aligned with the electrical pad; and then providing a conductive trace that extends from the dielectric layer in the first vertical direction and extends laterally on the dielectric layer and extends through the via opening in the second vertical direction to the electrical pad.

14. The method of claim 7, wherein the providing the plated through-hole and the forming the coreless build-up circuitry includes:

forming a through-hole that extends through the adhesive and the stiffener in the vertical directions; then providing a connecting layer on an inner sidewall of the through-hole;

providing an inner pad that extends from the stiffener in the first vertical direction and is adjacent to the connecting layer; then providing a dielectric layer that covers the electrical pad, the bump, the stiffener and the inner pad in the first vertical direction; then forming a via opening and an additional via opening in the dielectric layer, wherein the via opening is aligned with the electrical pad and the additional via opening is aligned with the inner pad; and then providing a conductive trace that extends from the dielectric layer in the first vertical direction and extends laterally on the dielectric layer and extends through the via opening and the additional via opening in the second vertical direction to the electrical pad and the inner pad.

15. The method of claim 7, wherein the providing the plated through-hole and the forming the coreless build-up circuitry includes:

providing a dielectric layer that covers the electrical pad, the bump and the stiffener in the first vertical direction; then forming a via opening in the dielectric layer, wherein the via opening is aligned with the electrical pad;

forming a through-hole that extends through the adhesive, the stiffener and the dielectric layer in the vertical directions;

providing a connecting layer on an inner sidewall of the through-hole; and providing a conductive trace that extends from the dielectric layer in the first vertical direction and extends laterally on the dielectric layer and extends through the via opening in the second vertical direction to the electrical pad.

16. A cavity substrate prepared by a method that comprises steps of:

providing a supporting board that includes a sacrificial carrier, a stiffener, an adhesive and an electrical pad, wherein (i) the sacrificial carrier includes a bump and a flange, (ii) the bump is adjacent to and integral with the flange and extends from the flange in a first vertical direction, (iii) the flange extends laterally from the bump in lateral directions orthogonal to the first vertical direction, (iv) the stiffener is attached to the sacrificial carrier via the adhesive between the stiffener and the flange and between the stiffener and the bump, and (v) the electrical pad extends beyond the bump in the first vertical direction and is covered by the bump in a second vertical direction opposite the first vertical direction; then forming a coreless build-up circuitry that covers the electrical pad, the bump and the stiffener in the first vertical direction and is electrically connected to the electrical pad; and removing the bump to form a cavity and expose the electrical pad and a portion of the coreless build-up circuitry from a closed end of the cavity, wherein the cavity is laterally covered and surrounded by the adhesive and faces in the second vertical direction.

17. The cavity substrate of claim 16, wherein the cavity substrate comprises:

the cavity that has a closed end in the first vertical direction and an open end in the second vertical direction;

the stiffener that includes an aperture, wherein the cavity extends into the aperture;

the adhesive that laterally covers and surrounds and conformally coats a sidewall of the cavity, extends laterally from the cavity to peripheral edges of the substrate and covers and contacts the stiffener in the second vertical direction;

the electrical pad that extends from the closed end of the cavity in the first vertical direction; and the coreless build-up circuitry that covers the electrical pad, the closed end of the cavity and adhesive in the first vertical direction and is coplanar with or higher than the electrical pad at the closed end of the cavity and is electrically connected to the electrical pad.

18. The cavity substrate of claim 17, wherein the cavity substrate further comprises:

a terminal that extends beyond the adhesive in the second vertical direction and is spaced from the coreless build-up circuitry by the adhesive and the stiffener; and a plated through-hole that extends through the adhesive and the stiffener to provide an electrical connection between the coreless build-up circuitry and the terminal.

19. The cavity substrate of claim 17, wherein the adhesive has a first thickness where it is adjacent to the sidewall of the cavity and a second thickness where it covers the stiffener in the second vertical direction that is different from the first thickness.

20. A method of making a cavity substrate, comprising:

providing a supporting board that includes a sacrificial carrier, a stiffener, and an adhesive, wherein (i) the sacrificial carrier includes a bump and a flange, (ii) the bump is adjacent to and integral with the flange and extends from the flange in a first vertical direction, (iii) the flange extends laterally from the bump in lateral directions orthogonal to the first vertical direction, and (iv) the stiffener is attached to the sacrificial carrier via the adhesive between the stiffener and the flange and between the stiffener and the bump;

forming a coreless build-up circuitry that covers the bump and the stiffener in the first vertical direction; and removing the bump to form a cavity and expose a portion of the coreless build-up circuitry from a closed end of the cavity, wherein the cavity is laterally covered and surrounded by the adhesive and faces in the second vertical direction.

* * * * *